US012738915B2

(12) United States Patent
Matsuda et al.

(10) Patent No.: US 12,738,915 B2
(45) Date of Patent: Sep. 15, 2026

(54) METHODS OF MANUFACTURING FILM BULK ACOUSTIC WAVE RESONATORS

(71) Applicant: SKYWORKS SOLUTIONS, INC., Irvine, CA (US)

(72) Inventors: Satoru Matsuda, Toyonaka (JP); Hiroyuki Tahara, Osaka (JP); Jun Hashimoto, Osaka (JP); Yasuhiro Yamauchi, Osaka (JP); Hiroki Kamiguchi, Hirakata (JP)

(73) Assignee: SKYWORKS SOLUTIONS, INC., Irvine, CA (US)

(*) Notice: Subject to any disclaimer, the term of this patent is extended or adjusted under 35 U.S.C. 154(b) by 627 days.

(21) Appl. No.: 18/165,423

(22) Filed: Feb. 7, 2023

(65) Prior Publication Data

US 2023/0253942 A1 Aug. 10, 2023

Related U.S. Application Data

(60) Provisional application No. 63/307,399, filed on Feb. 7, 2022.

(51) Int. Cl.

| | |
|---|---|
| ***H03H 3/02*** | (2006.01) |
| ***H03H 9/13*** | (2006.01) |
| ***H03H 9/17*** | (2006.01) |
| ***H03H 9/56*** | (2006.01) |

(52) U.S. Cl.

CPC .............. *H03H 3/02* (2013.01); *H03H 9/133* (2013.01); *H03H 9/173* (2013.01); *H03H 9/564* (2013.01); *H03H 2003/021* (2013.01); *H03H 9/568* (2013.01)

(58) Field of Classification Search

CPC .......... H03H 3/02; H03H 9/133; H03H 9/173; H03H 9/564; H03H 9/568; H03H 2003/021; H03H 9/02133

See application file for complete search history.

(56) References Cited

U.S. PATENT DOCUMENTS

| | | | | |
|---|---|---|---|---|
| 9,590,587 | B1 * | 3/2017 | Thalmayr | H03H 9/059 |
| 10,676,349 | B1 * | 6/2020 | Grosjean | H03H 9/02448 |

FOREIGN PATENT DOCUMENTS

| | | | |
|---|---|---|---|
| JP | 2013128267 A * | 6/2013 | H03H 9/02031 |

* cited by examiner

*Primary Examiner* — Andrea Lindgren Baltzell
*Assistant Examiner* — Kimberly E Glenn
(74) *Attorney, Agent, or Firm* — Lando & Anastasi, LLP

(57) ABSTRACT

Disclosed herein are embodiments of a method of manufacturing film bulk acoustic wave resonators. The method comprises forming a sacrificial layer over a surface of a substrate to form a plurality of film bulk acoustic wave resonators on the surface of the substrate, forming a piezoelectric film on the surface of the substrate to cover the sacrificial layer, and removing the sacrificial layer to form an air gap between the surface of the substrate and the piezoelectric film that has covered the sacrificial layer, the air gap corresponding to each of the plurality of film bulk acoustic wave resonators. The step of forming the piezoelectric film includes controlling a concentration distribution of an additive added to the piezoelectric film across the surface of the substrate to suppress a variation of the acoustic velocity of the piezoelectric film depending on a position on the main surface of the substrate.

16 Claims, 18 Drawing Sheets

RESONANT
FREQUENCY

ADDITIVE CONCENTRATION

METHODS OF MANUFACTURING FILM BULK ACOUSTIC WAVE RESONATORS

CROSS-REFERENCE TO RELATED APPLICATIONS

This application claims priority under 35 U.S.C. § 119(e) to U.S. Provisional Patent Application Ser. No. 63/307,399, titled "METHODS OF MANUFACTURING FILM BULK ACOUSTIC WAVE RESONATORS," filed Feb. 7, 2022, the entire content of which is incorporated herein by reference for all purposes.

BACKGROUND

Technical Field

Embodiments of this disclosure relate to methods of manufacturing film bulk acoustic wave resonators.

Description of Related Technology

Acoustic wave devices such as bulk acoustic wave (BAW) devices can be used as components for filters in radio frequency electronic systems. For instance, filters in a radio frequency front end of a mobile phone can include acoustic wave filters. Two acoustic wave filters can be arranged as a duplexer.

SUMMARY

Disclosed herein are embodiments of a method of manufacturing film bulk acoustic wave resonators. The method comprises preparing a substrate, forming a sacrificial layer over a main surface of the substrate to form a plurality of film bulk acoustic wave resonators on the main surface of the substrate, the sacrificial layer corresponding to each of the plurality of film bulk acoustic wave resonators, forming a piezoelectric film on the main surface of the substrate to cover the sacrificial layer, and removing the sacrificial layer to form an air gap between the main surface of the substrate and the piezoelectric film that has covered the sacrificial layer, the air gap corresponding to each of the plurality of film bulk acoustic wave resonators. The step of forming the piezoelectric film includes controlling a concentration distribution of an additive added to the piezoelectric film across the main surface of the substrate to cause an acoustic velocity distribution of the piezoelectric film to vary across the main surface of the substrate such that a variation of the acoustic velocity of the piezoelectric film depending on a position on the main surface of the substrate can be suppressed across the main surface of the substrate.

In some embodiments, the piezoelectric film can be formed as a single layer and the step of forming the piezoelectric film can include controlling a concentration distribution of the additive in the single layer. In some embodiments, the piezoelectric film can be formed from a plurality of layers and the step of forming the piezoelectric film can include controlling a concentration distribution of the additive in at least one of the plurality of layers.

Also disclosed herein are embodiments of a method of manufacturing film bulk acoustic wave resonators. The method comprises preparing a substrate, forming a sacrificial layer over a main surface of the substrate to form a plurality of film bulk acoustic wave resonators on the main surface of the substrate, the sacrificial layer corresponding to each of the plurality of film bulk acoustic wave resonators, forming a piezoelectric film on the main surface of the substrate to cover the sacrificial layer, and removing the sacrificial layer to form an air gap between the main surface of the substrate and the piezoelectric film that has covered the sacrificial layer, the air gap corresponding to each of the plurality of film bulk acoustic wave resonators. The step of forming the piezoelectric film includes controlling a stress distribution of the piezoelectric film across the main surface of the substrate such that a variation of the acoustic velocity of the piezoelectric film depending on a position on the main surface of the substrate can be suppressed across the main surface of the substrate.

In some embodiments, the piezoelectric film can be formed as a single layer and the step of forming the piezoelectric film can include controlling a stress distribution of the single layer. In some embodiments, the at least one can be formed from a plurality of layers and the step of forming the piezoelectric film can include controlling a stress distribution of at least one of the plurality of layers.

In some embodiments, the method can further include forming a bottom electrode for the piezoelectric film before forming the piezoelectric film, forming a top electrode on the piezoelectric film after forming the piezoelectric film, and forming a wiring layer connected to each of the bottom electrode and the top electrode. In some embodiments, the method can further include dicing the substrate on the main surface of which the plurality of film bulk acoustic wave resonators are formed into chips, each chip including at least one film bulk acoustic wave resonator.

In some embodiments, the film bulk acoustic wave resonator can be a film bulk acoustic wave resonator manufactured by a method described above.

Also disclosed herein are embodiments of a film bulk acoustic wave filter assembly comprising a first film bulk acoustic wave filter coupled to a common node and a second film bulk acoustic wave filter coupled to the common node, the first and second film bulk acoustic wave filters being configured to filter a radio frequency signal and including a plurality of film bulk acoustic wave resonators, at least one of the plurality of film bulk acoustic wave resonators being the film bulk acoustic wave resonator described above. In some embodiments, the film bulk acoustic wave filter assembly can further include a third film bulk acoustic wave filter coupled to the common node and a fourth film bulk acoustic wave filter coupled to the common node.

Also disclosed herein are embodiments of a wireless communication device comprising an antenna and a multiplexer coupled to the antenna, the multiplexer including a plurality of filters coupled to the common node to filter a radio frequency signal, the plurality of filters including a film bulk acoustic wave filter having a plurality of film bulk acoustic wave resonators, at least one of the plurality of film bulk acoustic wave resonators being the film bulk acoustic wave resonator described above.

BRIEF DESCRIPTION OF THE DRAWINGS

FIGS. 3A to 3E are cross-sectional views representing a method of manufacturing a film bulk acoustic wave resonator;

DETAILED DESCRIPTION OF CERTAIN EMBODIMENTS

Figure 1:
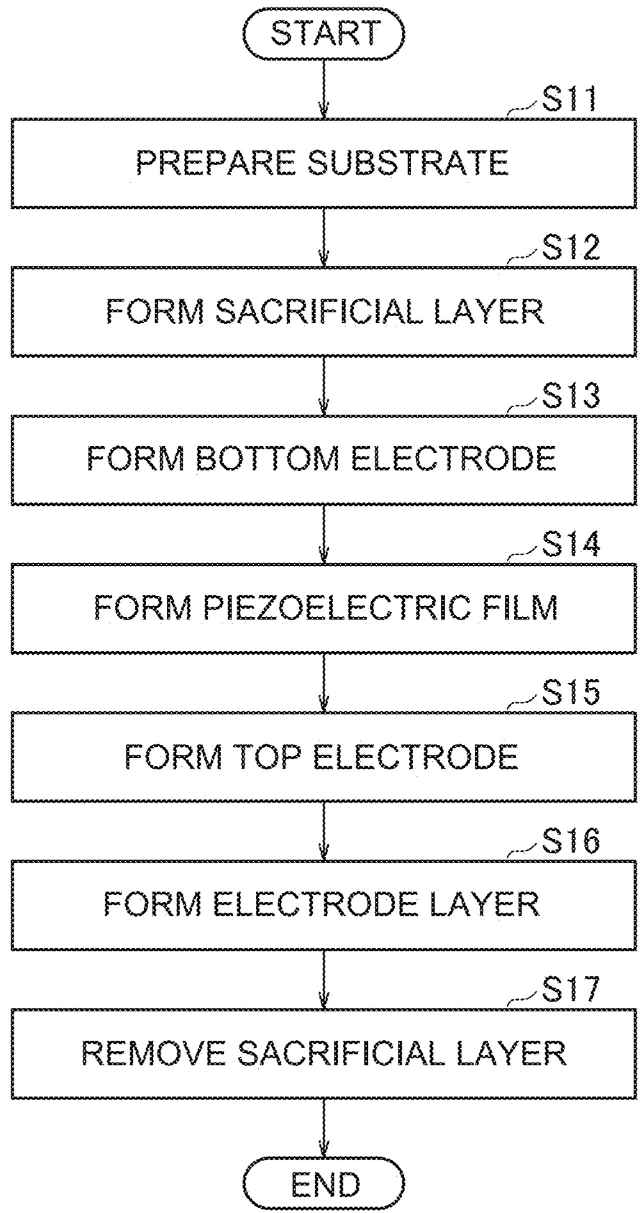
FIG. 1 is a flow diagram showing a series of steps in a method of manufacturing film bulk acoustic wave resonators.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film Bulk Acoustic Wave Resonators

A film bulk acoustic wave resonator (FBAR) is a type of a bulk acoustic wave (BAW) resonator commonly including a piezoelectric film. This piezoelectric film can be sandwiched between a top electrode and a bottom electrode and suspended over a cavity that may allow the piezoelectric film to oscillate. A signal applied between the top electrode and the bottom electrode may generate an acoustic wave in the piezoelectric film and the acoustic wave may propagate through the film. A piezoelectric film for a plurality of FBARs is stacked on a main surface of a substrate such as a wafer and then the stack is diced into separated FBARs. The FBAR has a resonant frequency determined by an acoustic velocity of the piezoelectric film to an applied signal. However, the acoustic velocity of the piezoelectric film may generally vary depending on a location across the substrate and thus the resonant frequency may also vary depending on a location across the substrate, the location corresponding to each FBAR formed by dicing the substrate. Accordingly, for adjusting an acoustic velocity of a piezoelectric film, trimming or scraping an electrode or a dielectric over or under the piezoelectric film has been performed to equalize the resonant frequencies of respective FBARs.

First Embodiment

FIG. 1 is a flow diagram showing a series of steps in a method of manufacturing FBARs. To begin with, at step S11, a substrate is prepared for manufacturing FBARs. According to an embodiment, a silicon wafer, which has a certain diameter allowing FBARs to be simultaneously formed on its main surface, is assumed to be used. Although a silicon wafer is discussed in an embodiment, the material of the substrate may include aluminum nitride, silicon nitride, magnesium oxide spinel, magnesium oxide crystal, sapphire, or another type of material.

Figure 2:
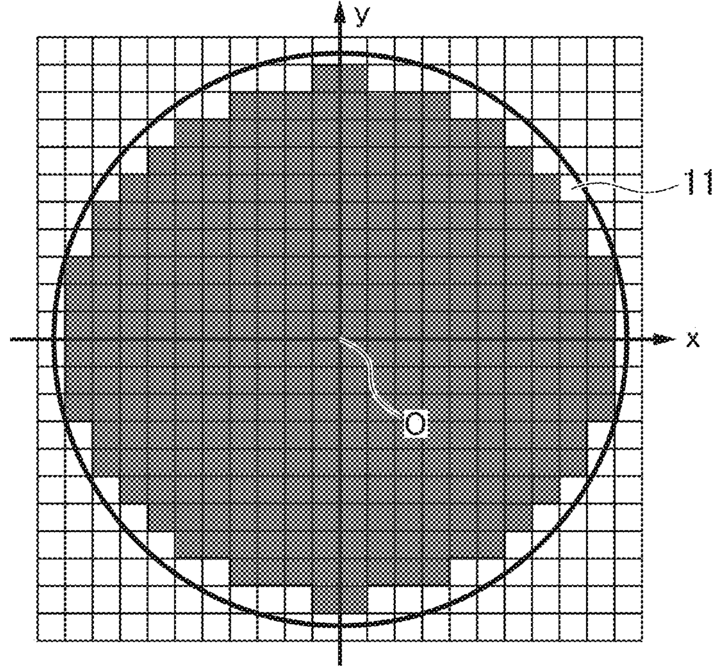
FIG. 2 is a plan view showing a main surface of a substrate wafer.

FIG. 2 is a plan view showing a main surface of a substrate wafer 11 on which FBARs are formed. In FIG. 2, the wafer substrate 11 exists in an area inside a circle, and the FBARs formed on the main surface of the wafer substrate 11 are diced into FBAR chips along grid lines. Hereinafter, for convenience of illustration, the origin O is set substantially at the center of the main surface of the wafer substrate 11, and the x-y coordinates are set along the lines for dicing on the main surface.

Figures 3A, 3B, 3C, 3D, 3E:
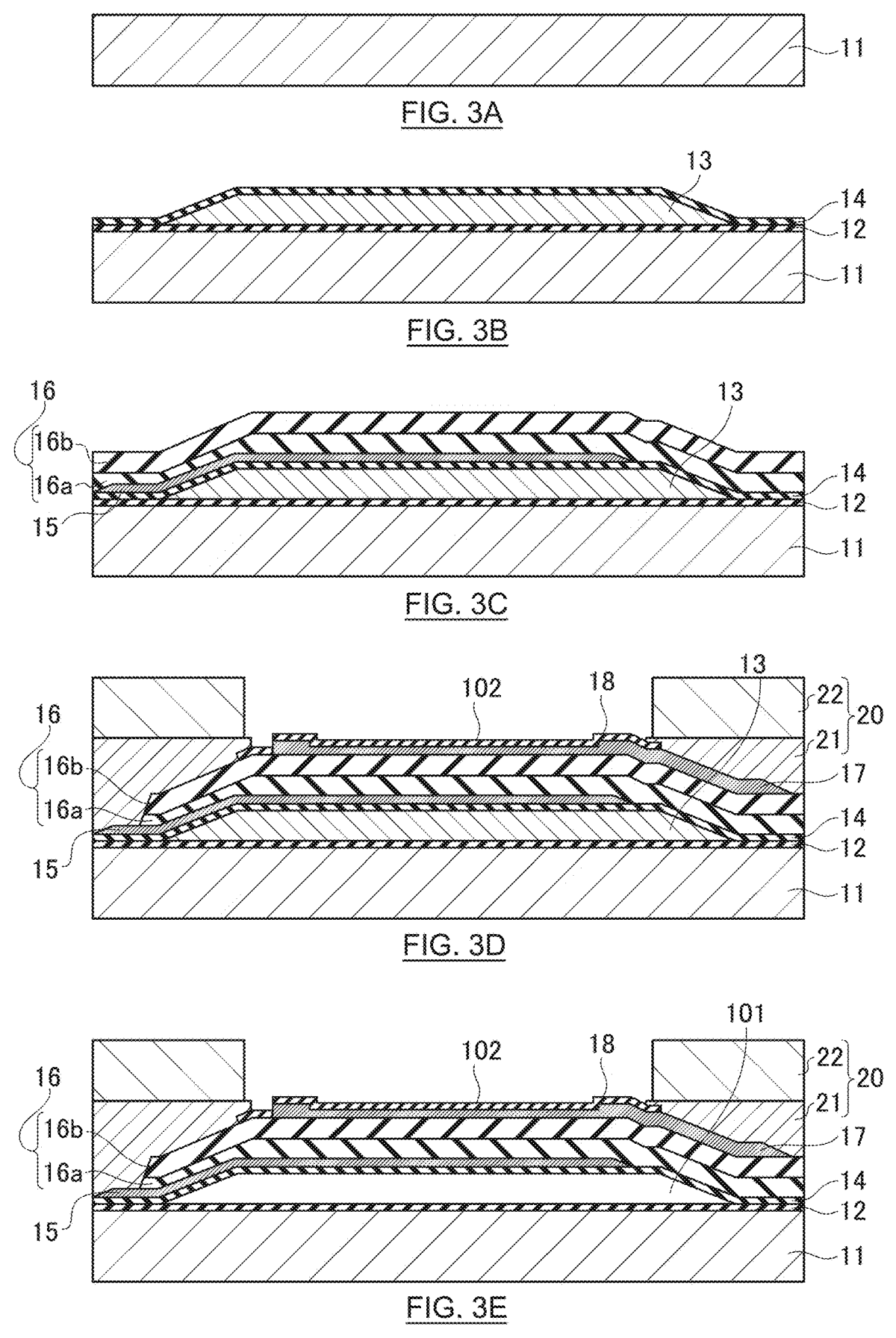

FIG. 3A is a cross-sectional view of the wafer substrate 11 of silicon. The top surface of the substrate 11 corresponds to the main surface thereof. Although the substrate 11 is the wafer substrate on which a plurality of FBARs are formed, the substrate 11 described here corresponds to a portion of the wafer substrate on which a single FBAR is formed, for convenience of illustration. The same applies to FIG. 3B and other drawings.

At step S12, a sacrificial layer 13 is formed on the main surface of the substrate 11. As shown in the cross-sectional view of FIG. 3B, a first passivation layer 12 such as a silicon oxide layer is formed to cover the main surface of the substrate 11. Then, the sacrificial layer 13 is formed on the first passivation layer 12. The sacrificial material may be, for example, amorphous silicon or polysilicon. As shown in FIG. 3B, the sacrificial layer 13 has a convex shape in which angled edges are formed. Further, a second passivation layer 14 such as a silicon oxide layer is formed on the main surface of the substrate 11 to cover the first passivation layer 12 and the sacrificial layer 13. The sacrificial layer 13 is removed in a later step to form an air gap.

At step S13, a bottom electrode 15 is formed on the second passivation layer 14 that covers the main surface of the substrate 11 on which the sacrificial layer 13 is formed. As shown in the cross-sectional view of FIG. 3C, the bottom electrode 15 is paired with a top electrode described below to sandwich a piezoelectric film 16 and is used to apply a voltage to the piezoelectric film 16 and detect a voltage generated from the piezoelectric film 16. The bottom electrode 15 can be formed from metal such as copper.

At step S14, the piezoelectric film 16, that can be a thin film of a piezoelectric material, is formed to cover the second passivation layer 14 that is disposed over the main surface of the substrate 11 on which the sacrificial layer 13 is formed, and the bottom electrode 15 that is disposed on the second passivation layer 14. The piezoelectric film 16 is formed to have a dome shape corresponding to the convex shape of the sacrificial layer 13.

As shown in the cross-sectional view of FIG. 3C, the piezoelectric film 16 according to the first embodiment is formed by stacking a lower first piezoelectric film 16*a* formed from a piezoelectric material such as aluminum nitride (AlN) or zinc oxide (ZnO) and an upper second piezoelectric film 16*b*, which is also formed from a piezoelectric material but has a stress distribution appropriately configured as described below. The first piezoelectric film 16*a* and the second piezoelectric film 16*b* can have substantially the same thickness in an active region 102 as shown in FIGS. 3D and 3E, in which the piezoelectric film 16 is allowed to oscillate.

When the piezoelectric film 16 is formed, the first piezoelectric film 16*a* and the second piezoelectric film 16*b* can be deposited and formed in the same chamber or can be deposited and formed in separate chambers. According to the process using the same chamber, a transition time for shifting a condition such as a chamber atmosphere for depositing the first piezoelectric film 16*a* to another condition for depositing the second piezoelectric film 16*b* would be utilized. In contrast, according to the process of depositing and forming the first and second piezoelectric films 16*a* and 16*b* in separate chambers, the transition time for shifting the conditions can be shortened and the transition from the step of depositing the first piezoelectric film 16*a* to the step of depositing the second piezoelectric film 16*b* can be smoother, although the number of chambers to be used can be increased. The same applies to a second embodiment described below.

Figure 4:
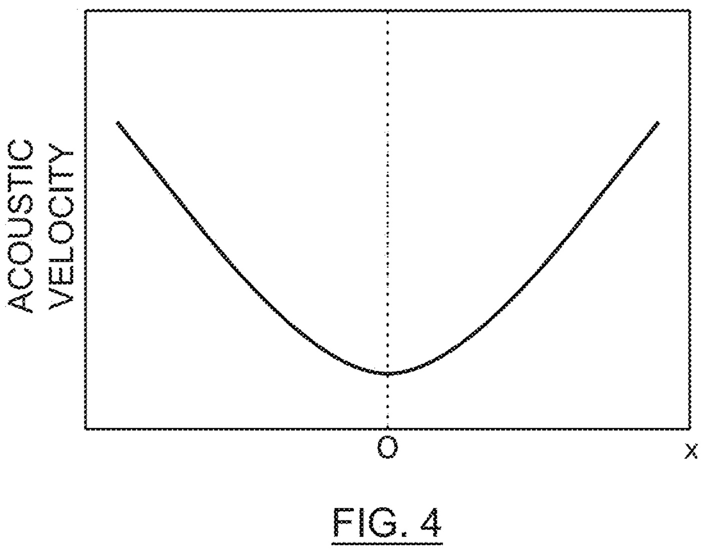
FIG. 4 is a graph showing an acoustic velocity distribution of a piezoelectric film across a substrate.

FIG. 4 is a graph showing an acoustic velocity distribution of the first piezoelectric film 16*a* across the substrate 11 of the FBAR in which the piezoelectric film 16 is formed only by the first piezoelectric film 16*a* of aluminum nitride. In this graph, both the vertical and horizontal axes represent arbitrary units. The same is applied to the other graphs discussed below. The resonant frequency of such an FBAR can be substantially proportional to the acoustic velocity of the first piezoelectric film 16*a* and thus also varies in the x-direction. Since the first piezoelectric film 16*a* is stacked on the main surface of the wafer substrate 11, the stress on the main surface of the substrate 11 can be assumed to affect the acoustic velocity distribution. The acoustic velocity curve having the minimum value around the origin O monotonically increases from the origin O to the circumference shown in FIG. 2. In other words, the acoustic velocity distribution can exhibit a substantially U-shaped curve symmetric with respect to the origin O as shown in FIG. 4.

Figure 5A:
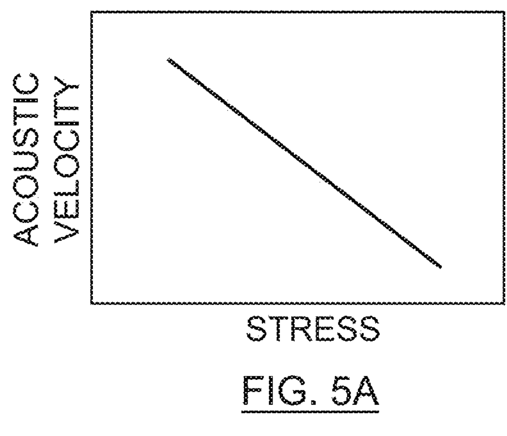
FIG. 5A is a graph showing a relationship between a stress and an acoustic velocity of a piezoelectric film.
Figure 5B:
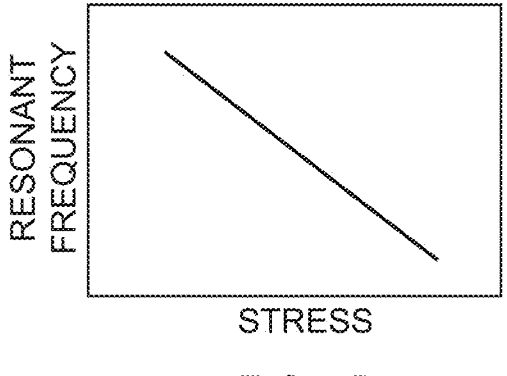
FIG. 5B is a graph showing a relationship between a stress and a resonant frequency of a piezoelectric film.

FIG. 5A is a graph showing a relationship between a stress and an acoustic velocity of the piezoelectric film 16. FIG. 5B is a graph showing a relationship between a stress and a resonant frequency of the piezoelectric film 16. As can be seen in FIGS. 5A and 5B, the acoustic velocity and the resonant frequency are both monotonically decreasing functions with respect to the stress. The relationship between the stress and the acoustic velocity/resonant frequency can be similarly applied to each of the first and second piezoelectric films 16*a* and 16*b*.

Figure 6:
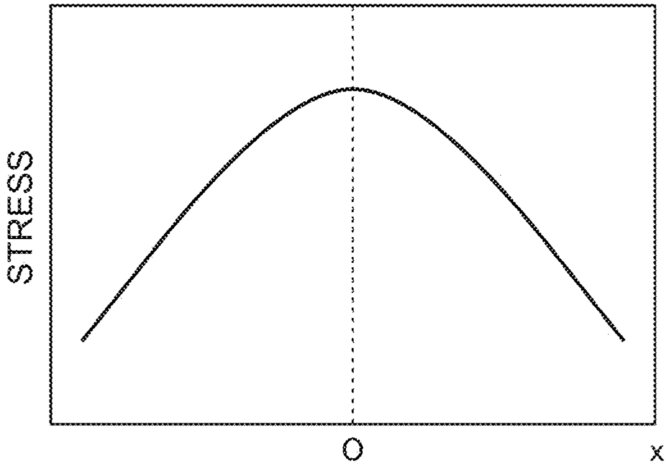
FIG. 6 is a graph showing a stress distribution of a piezoelectric film across a substrate.

FIG. 6 is a graph showing a stress distribution of the first piezoelectric film 16*a* across the substrate 11. The acoustic velocity across the piezoelectric film 16 is a monotonically decreasing function with respect to the stress as previously shown in FIG. 5A. The graph of FIG. 6 is obtained by using the relationship shown in FIG. 5A between the stress and the x-direction position and converting the relationship shown in FIG. 4 between the acoustic velocity and the x-direction position across the first piezoelectric film 16*a* into the relationship between the stress and the x-direction position. Since the first piezoelectric film 16*a* is stacked on the main surface of the wafer substrate 11, the stress on the main surface of the substrate 11 can be assumed to affect the stress distribution. The stress curve having the maximum value around the origin O monotonically decreases from the origin O to the circumference shown in FIG. 2. In other words, the acoustic velocity distribution can exhibit a substantially inverted U-shaped curve symmetric with respect to the origin O as shown in FIG. 6.

Figure 7:
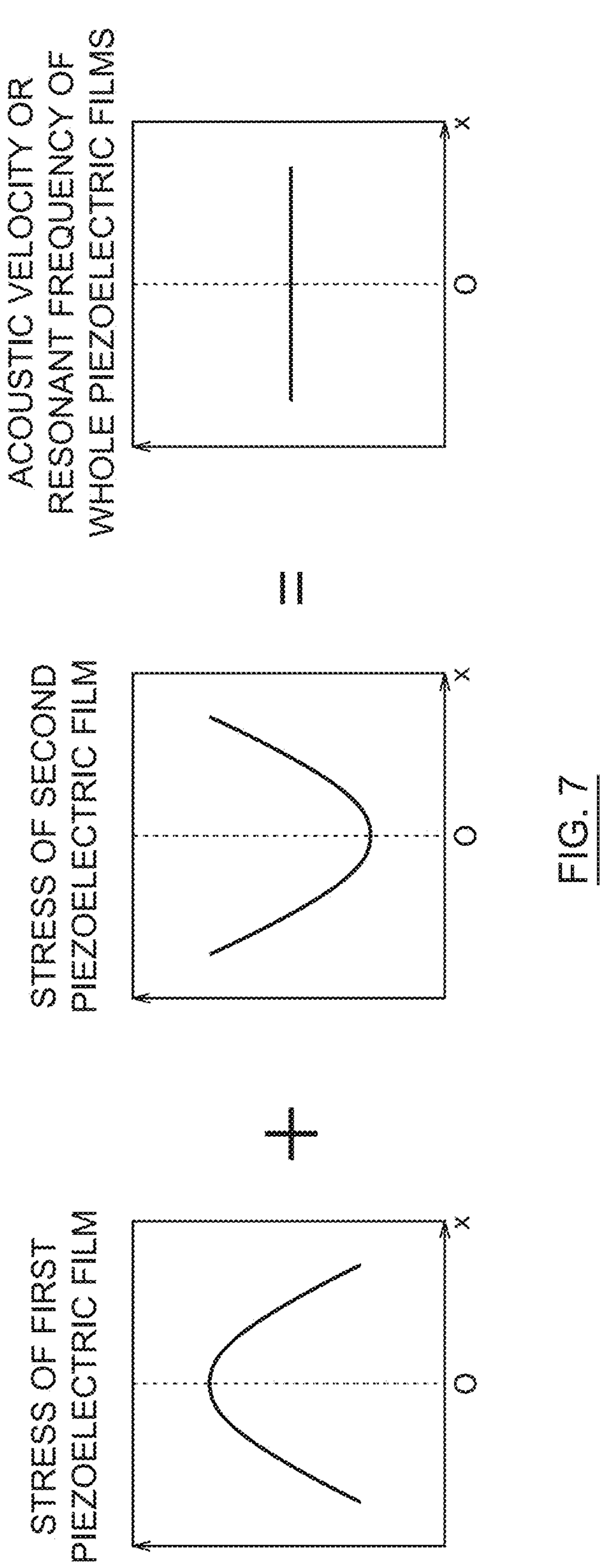
FIG. 7 is a schematic view illustrating a principle of fabricating a piezoelectric film according to a first embodiment.

FIG. 7 is a schematic view illustrating a principle of fabricating the piezoelectric film 16 according to the first embodiment. The stress distribution of the first piezoelectric film 16*a* in the x-direction exhibits a substantially inverted U-shaped curve symmetric with respect to the origin O as shown in FIG. 6. According to the first embodiment, the stress distribution of the second piezoelectric film 16*b* is configured to exhibit a substantially U-shaped curve symmetric with respect to the origin O to compensate the stress distribution of the first piezoelectric film 16*a*.

Configuring the stress distribution of the second piezoelectric film 16*b* as such may allow the sum of the stress of the first piezoelectric film 16*a* and the stress of the second piezoelectric film 16*b* to be uniformly distributed along the x-direction in the piezoelectric film 16. The acoustic velocity and the resonant frequency can monotonically decrease as a function of stress as shown in FIGS. 5A and 5B, respectively, such that configuring the stress of the piezoelectric film 16 to be uniformly distributed can cause the acoustic velocity and the resonant frequency of the piezoelectric film 16 to be also uniformly distributed. Thus, as shown in a right-side graph of FIG. 7, the acoustic velocity or resonant frequency of the piezoelectric film 16 can be uniformly distributed regardless of the position in the x-direction. Accordingly, FBARs formed by dicing the substrate 11 into chips also have a uniform resonant frequency regardless of the position in the x-direction across the main surface of the substrate 11.

Referring back to FIG. 1, at step S15, a top electrode 17 is formed on the second piezoelectric film 16*b* forming the piezoelectric film 16. As shown in FIG. 3D, the top electrode 17 is paired with the bottom electrode 15 to sandwich the piezoelectric film 16 and is used to apply a voltage to the piezoelectric film 16 and to detect a voltage generated from the piezoelectric film 16. The top electrode 17 can be formed from metal such as copper. A third passivation layer 18 such as a silicon nitride layer is formed on the second piezoelectric film 16 to cover the top electrode 17 over the active region 102 where the piezoelectric film 16 can oscillate.

At step S16, an electrode layer 20 connected to each of the bottom electrode 15 and the top electrode 17 is formed. As shown in FIG. 3D, the electrode layer 20 includes a lower first electrode layer 21 formed from metal such as ruthenium (Ru), molybdenum (Mo), tungsten (W) or chromium (Cr) and an upper second electrode layer 22 formed from metal such as titanium (Ti) or copper (Cu).

At step S17, the sacrificial layer 13 is removed. The convex sacrificial layer 13, which is formed on the main surface of the substrate 11 via the first passivation layer 12 and is covered with the piezoelectric film 16 via the second passivation layer 14 and the bottom electrode 15 as shown in the cross-sectional view of FIG. 3D, is removed by etching. As shown in FIG. 3E, removing the sacrificial layer 13 creates an air gap 101 covered with the piezoelectric film 16 and the like that are raised in a dome shape from the main surface of the substrate 11 to enclose the sacrificial layer 13.

In the first piezoelectric film 16*a* and the second piezoelectric film 16*b* forming the piezoelectric film 16 of FBARs that are formed on the main surface of the substrate according to the first embodiment, the stress distribution in the second piezoelectric film 16*b* is controlled to allow the sum of the stresses of the first piezoelectric film 16*a* and the second piezoelectric film 16*b* to be prevented from varying across the main surface and thus to be uniformly distributed at any position on the main surface. Accordingly, the sound velocity and the resonant frequency, which are monotonically decreasing functions with respect to the stress, can be prevented from varying across the main surface, and can be uniformly distributed with respect to the position across the main surface. Thus, a uniform resonance frequency can be obtained in respective FBARs that are formed by dicing a plurality of FBARs formed on the substrate 11 into chips.

The FBARs manufactured according to the first embodiment can have a uniform resonant frequency no matter where respective FBARs exist on the main surface before being diced. This can eliminate a process of trimming or scraping the piezoelectric film 16 and/or an electrode or the like over or under the piezoelectric film 16 to adjust respective acoustic velocities.

Although the piezoelectric film 16 is formed by stacking the first piezoelectric film 16*a* and the second piezoelectric film 16*b* according to the first embodiment, the piezoelectric film 16 can be formed by stacking three or more piezoelectric films, and the stress distribution of at least one of these piezoelectric films can be controlled. Further, the sequential steps shown in the flow diagram of FIG. 1 is merely an example and is not limited thereto.

First Variation

Figure 8:
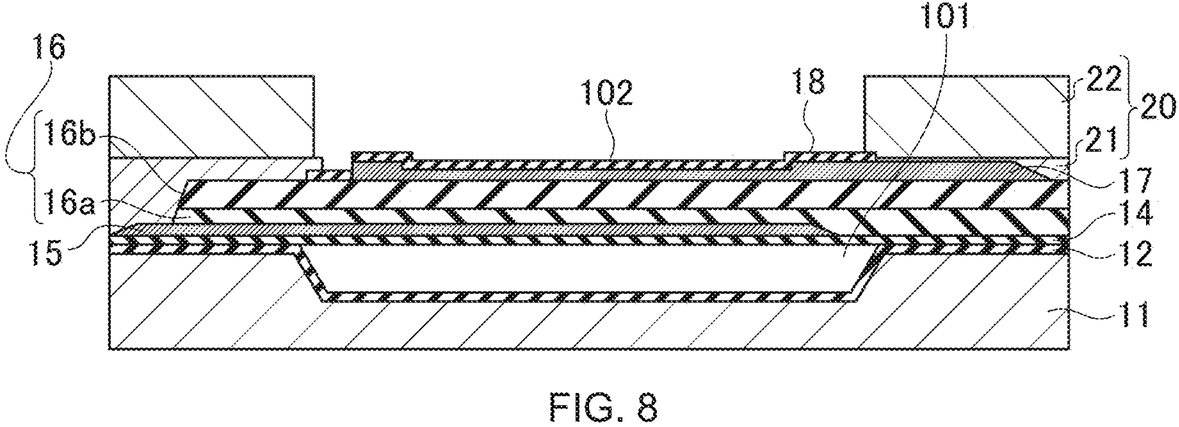
FIG. 8 is a cross-sectional view showing a film bulk acoustic resonator according to a first variation.

FIG. 8 is a cross-sectional view showing an FBAR of a first variation formed by a method of manufacturing the FBAR according to the first embodiment. In the FBAR of the first variation shown in FIG. 8, the air gap 101 is formed by a recess in the substrate 11, and the piezoelectric film 16 is formed along the main surface of the substrate 11 to cover the recess. Since the other configuration of the FBAR of the first variation is similar to the FBAR of the first embodiment, like reference numerals are used to indicate identical components to clarify the correspondence relationships in FIG. 8. The FBAR of the first variation is also manufactured by the same process as the manufacturing method of the first embodiment shown in FIG. 1.

Second Variation

Figure 9A:
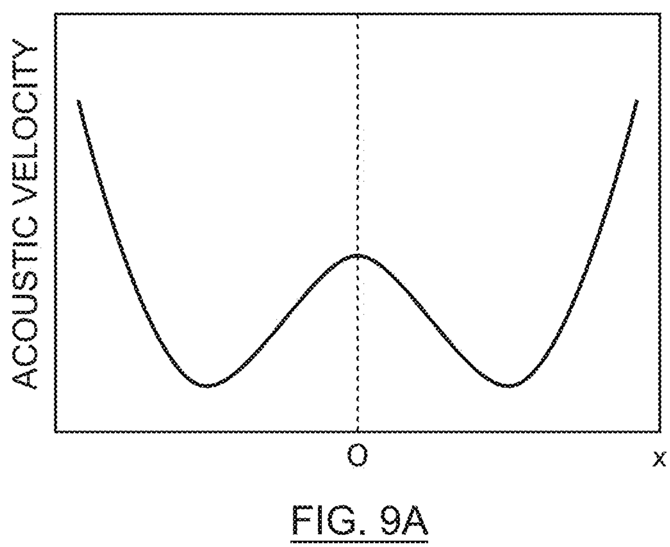
FIG. 9A is a graph showing an acoustic velocity distribution of a piezoelectric film across a substrate according to a second variation.

FIG. 9A is a graph showing an acoustic velocity distribution in the x-direction across the first piezoelectric film 16*a* according to a second variation. According to the second variation, from the origin O to the circumference shown in FIG. 2, the acoustic velocity exhibits a curve that once decreases from a maximum value around the origin O to a minimum value at a position in the x-direction and then increases beyond the maximum value as shown in FIG. 9A. In other words, the acoustic velocity distribution according to the second variation has a substantially W-shaped curve symmetric with respect to the origin O.

Figure 9B:
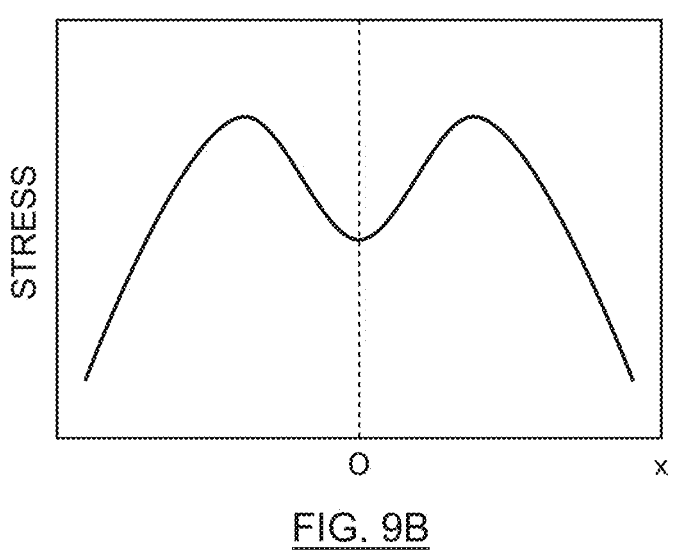
FIG. 9B is a graph showing a stress distribution of a piezoelectric film across a substrate according to the second variation.

FIG. 9B is a graph showing a stress distribution in the x-direction across the first piezoelectric film 16*a* according to the second variation. The acoustic velocity across the piezoelectric film 16*a* is a monotonically decreasing function with respect to the stress as previously shown in FIG. 5A. The graph of FIG. 9B is obtained by using the relationship shown in FIG. 5A between the stress and the x-direction position and converting the relationship shown in FIG. 9A between the acoustic velocity and the x-direction position across the first piezoelectric film 16*a* into the relationship between the stress and the x-direction position. According to the second variation, from the origin O to the circumference shown in FIG. 2, the stress exhibits a curve that once increases from a minimum value around the origin O to a maximum value at a position in the x-direction and then decreasing beyond the minimum value as shown in FIG. 9B. In other words, the stress distribution of the second variation has a substantially inverted W-shaped curve symmetric with respect to the origin O.

Figure 10:
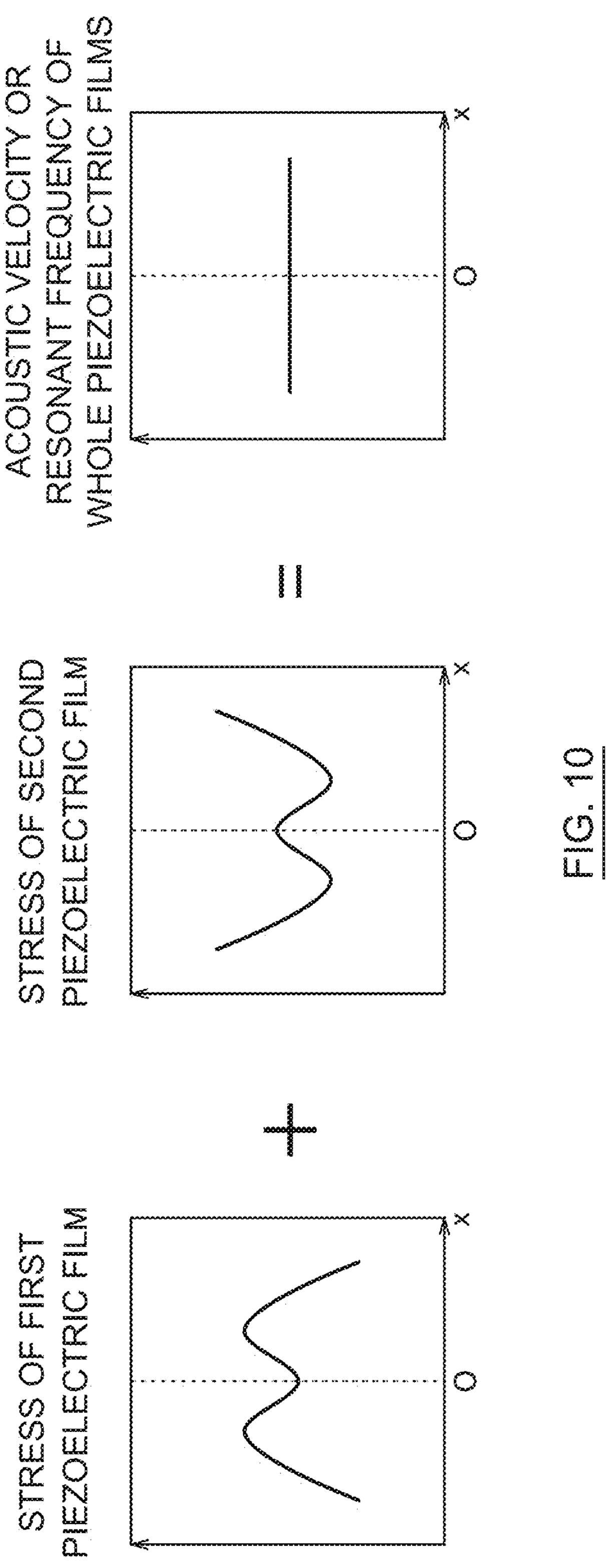
FIG. 10 is a schematic diagram illustrating a principle of fabricating a piezoelectric film according to the second variation.

FIG. 10 is a schematic diagram illustrating a principle of fabricating the piezoelectric film 16 according to the second variation. The stress distribution in the first piezoelectric film 16*a* exhibits a substantially W-shaped curve symmetric with respect to the origin O as shown in FIG. 9B. According to the second variation, the stress distribution of the second piezoelectric film 16*b* is configured to exhibit a substantially W-shaped curve symmetric with respect to the origin O to compensate the stress distribution of the first piezoelectric film 16*a*.

Configuring the stress distribution of the second piezoelectric film 16*b* as such may allow the sum of the stress of the first piezoelectric film 16*a* and the stress of the second piezoelectric film 16*b* to be uniformly distributed along the x-direction in the combined piezoelectric film 16. The acoustic velocity and the resonant frequency can monotonically decrease as a function of stress as shown in FIGS. 5A and 5B, respectively, such that configuring the stress of the piezoelectric film 16 to be uniformly distributed can cause the acoustic velocity and the resonant frequency of the piezoelectric film 16 to be also uniformly distributed. Thus, as shown in a right-side graph of FIG. 10, the acoustic velocity or resonant frequency of the piezoelectric film 16 can be uniformly distributed regardless of the position in the x-direction. Accordingly, FBARs formed by dicing the substrate 11 into chips also have a uniform resonant frequency regardless of the position in the x-direction across the main surface of the substrate 11.

Although the stress distribution in the first piezoelectric film 16*a* forming the piezoelectric film 16 according to the second variation exhibits a substantially inverted W-shaped curve symmetric with respect to the origin O as shown in FIG. 9B, the stress distribution curve of the first piezoelectric film 16*a* can have another shape. Even in instances of the other shape, configuring the stress distribution of the second piezoelectric film 16*b* to compensate the stress distribution of the first piezoelectric film 16*a* can allow the sum of the stresses of the first and second piezoelectric films 16*a* and 16*b* to be prevented from varying across the main surface and thus to be uniformly distributed at any position on the main surface. Accordingly, the sound velocity and the resonant frequency, which are monotonically decreasing functions with respect to the stress, can be prevented from varying across the main surface, and can be uniformly distributed with respect to the position across the main surface.

Second Embodiment

Referring back to the flow diagram of FIG. 1, a method of manufacturing FBARs according to a second embodiment is similar to the method of the first embodiment except for the step of forming the piezoelectric film at step S14. Thus, step S14 of forming the piezoelectric film according to the second embodiment will be described below.

Referring to the cross-sectional view of FIG. 3C, the piezoelectric film 16 is formed to cover the passivation layer 14 that is disposed on the sacrificial layer 13 formed over the main surface of the substrate, and the bottom electrode 15 that is disposed on the second passivation layer 14, similar to step S14 of the first embodiment. According to the second embodiment, the piezoelectric film 16 is formed by stacking a lower first piezoelectric film 16*a* formed from a piezoelectric material such as aluminum nitride (AlN) or zinc oxide (ZnO) and an upper second piezoelectric film 16*b* formed from a piezoelectric film doped with an additive such as scandium (Sc), titanium (Ti), magnesium (Mg), zirconium (Zr), or hafnium (Hf). This is different from the first embodiment in which the stress distribution is appropriately configured in the second piezoelectric film 16*b*. The first and second piezoelectric films 16*a* and 16*b* can have substantially the same thickness in the active region 102 (see FIGS. 3D and 3E) in which the piezoelectric film 16 is allowed to oscillate.

Figures 11A, 11B:
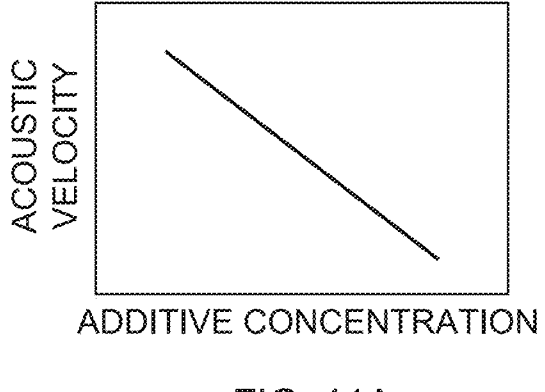
FIG. 11A is a graph showing a relationship between an additive concentration and an acoustic velocity of a piezoelectric film.
FIG. 11B is a graph showing a relationship between an additive concentration and a resonant frequency of a piezoelectric film.

FIG. 11A is a graph showing a relationship between an additive concentration and an acoustic velocity of the piezoelectric film 16. FIG. 11B is a graph showing a relationship between an additive concentration and a resonant frequency of the piezoelectric film 16. As can be seen in FIGS. 11A and 11B, the acoustic velocity and the resonant frequency are both monotonically decreasing functions with respect to the additive concentration. The relationship between the additive concentration and the resonant frequency can be similarly applied to each of the first and second piezoelectric films 16*a* and 16*b*.

Figure 12:
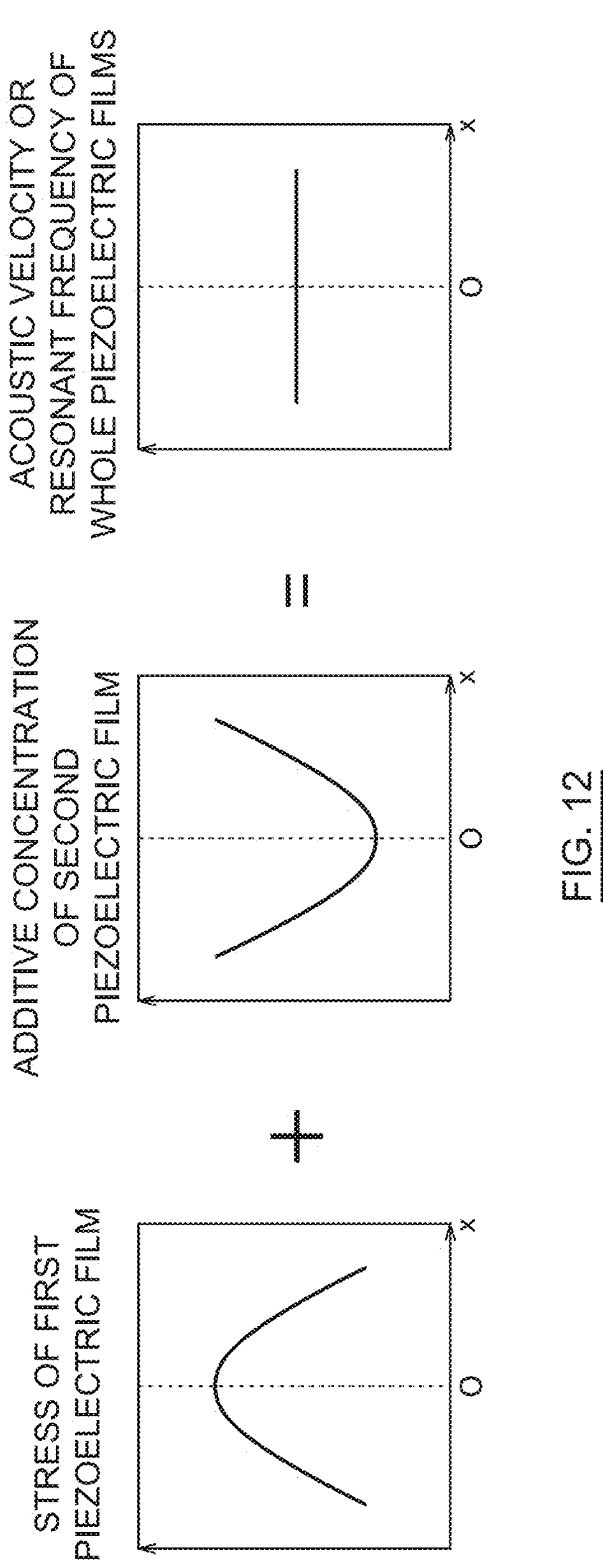
FIG. 12 is a schematic view illustrating a principle of fabricating a piezoelectric film according to a second embodiment.

FIG. 12 is a schematic view illustrating a principle of fabricating the piezoelectric film 16 according to the second embodiment. The stress distribution of the first piezoelectric film 16*a* along the x-direction exhibits a substantially inverted U-shaped curve symmetric with respect to the origin O as shown in FIG. 6. According to the second embodiment, controlling the concentration distribution of the additive added to the second piezoelectric film 16*b* as shown in the central graph of FIG. 12 can compensate the acoustic velocity or resonant frequency distribution originated from the stress distribution of the first piezoelectric film 16*a* as shown in the left-side graph of FIG. 12 and allow the acoustic velocity or resonant frequency to be uniformly distributed along the x-direction in the first and second piezoelectric films 16*a* and 16*b* as a whole as shown in the right-side graph of FIG. 12.

The acoustic velocity and the resonant frequency can monotonically decrease as a function of additive concentration as shown in FIGS. 11A and 11B, respectively, similar to the relationship of the acoustic velocity and resonant frequency versus the stress as shown in FIGS. 5A and 5B, respectively. Accordingly, the concentration of the additive added to the second piezoelectric film 16*b* is configured to be distributed following the substantially U-shaped curve symmetrical with respect to the origin O.

Appropriately configuring the concentration distribution of the additive added to the second piezoelectric film 16*b* can allow the acoustic velocity or resonant frequency distribution originated from the stress distribution of the first piezoelectric film 16*a* to be compensated by the acoustic velocity or resonant frequency distribution originated from the concentration distribution of the additive added to the second piezoelectric film 16*b*. Thus, the acoustic velocity or resonant frequency can be uniformly distributed across the piezoelectric film 16 including the first and second piezoelectric films 16*a* and 16*b*. As shown in the right-side graph of FIG. 12, the acoustic velocity or resonant frequency of the piezoelectric film 16 can be uniformly distributed regardless of the position in the x-direction. Accordingly, FBARs formed by dicing the substrate 11 into chips also have a uniform resonant frequency regardless of the position in the x-direction across the main surface of the substrate 11.

The FBARs manufactured according to the second embodiment can have a uniform resonant frequency no matter where respective FBARs exist on the main surface of the wafer before being diced. This can eliminate a process of trimming or scraping the piezoelectric film 16 and the like to adjust respective resonant frequencies.

It is to be appreciated that in a variation of the second embodiment, the lower first piezoelectric film 16*a* may have a doping profile that compensates for a non-uniform acoustic velocity profile caused by a non-uniform stress distribution in the upper second piezoelectric film 16*b*. Although the piezoelectric film 16 is formed by stacking the first piezoelectric film 16*a* and the second piezoelectric film 16*b* according to the second embodiment, the piezoelectric film 16 can be formed by stacking three or more piezoelectric films, and the concentration distribution of the additive added to at least one of these piezoelectric films can be controlled.

Experimental Examples

Figure 13A:
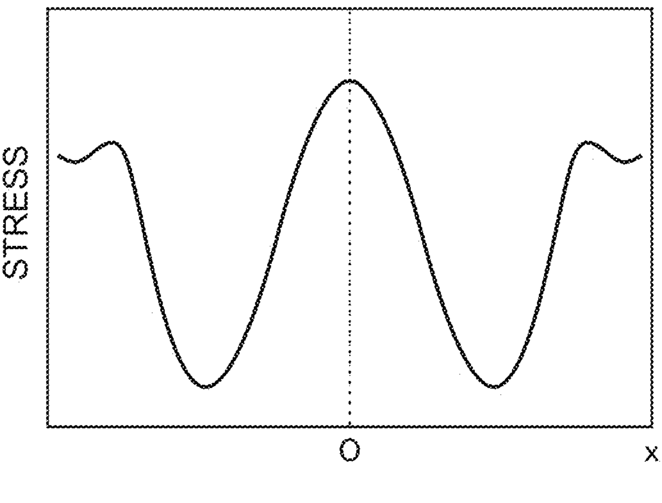
FIG. 13A is a graph showing a stress distribution across a substrate according to a comparative example.

The second embodiment was experimentally verified. FIG. 13A is a graph showing a stress distribution across a substrate of a comparative example. This comparative example was formed by an integrated structure of lower first and upper second piezoelectric films 16*a* and 16*b* in an FBAR generally shown in FIG. 3E. The integrated piezoelectric film 16 was formed from aluminum nitride (AlN) to which scandium (Sc) was added at a certain concentration. The thickness of the piezoelectric film 16 was 1000 nanometers (nm). As a result of measurement, the stress distribution in the piezoelectric film 16 was observed as exhibiting substantially W-shaped symmetric with respect to the origin O. The stress variation range was 217 megapascal (MPa).

Figure 13B:
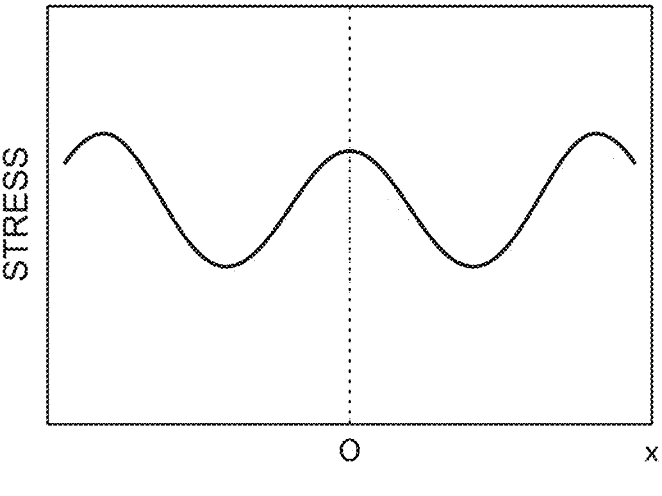
FIG. 13B is a graph showing a stress distribution across a substrate according to an embodiment.

FIG. 13B is a graph showing a stress distribution across a substrate 11 according to the experimental example. An FBAR according to the experimental example had a structure similar to that of the comparative example as shown in FIG. 3E; however, the lower first piezoelectric film 16*a* was formed from AlN whereas the upper second piezoelectric film 16*b* was formed from AlN to which Sc was added. The second piezoelectric film 16*b* of the experimental example was adjusted to have an amount of Sc substantially equal to that of the comparative example and the stress of the first and second piezoelectric films 16*a* and 16*b* of the experimental example were also adjusted such that the first and second piezoelectric films 16*a* and 16*b* of the experimental example can as a whole have a stress variation range substantially half of that of the piezoelectric film 16 of the comparative example. As a result of measurement, the stress distribution in the piezoelectric film 16 of the experimental example exhibited a substantially W-shaped curve symmetry with respect to the origin O similar to that of the comparative example, but the stress variation range was 118 MPa, which was substantially half of the comparative example.

Figure 14:
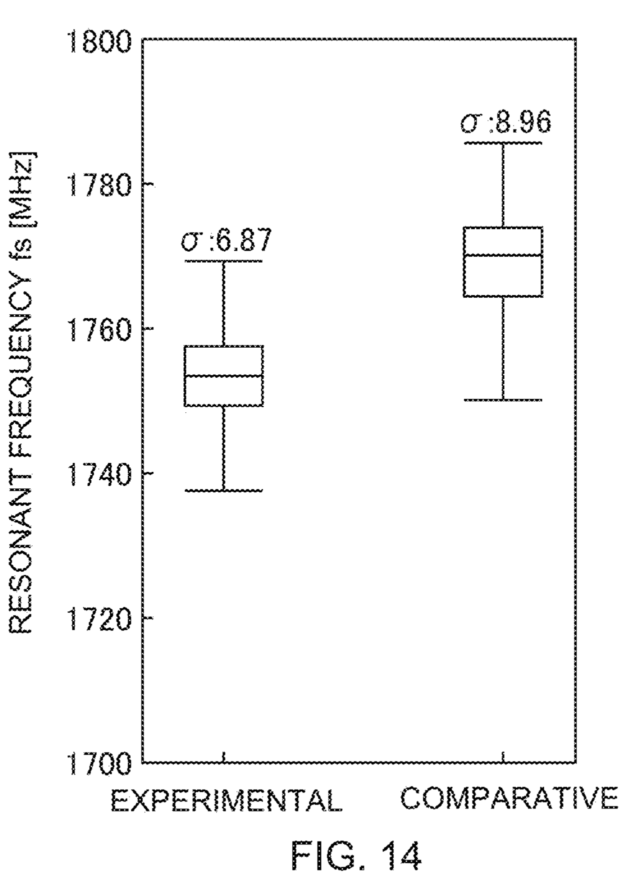
FIG. 14 is a graph showing a resonant frequency distribution.
Figure 15:
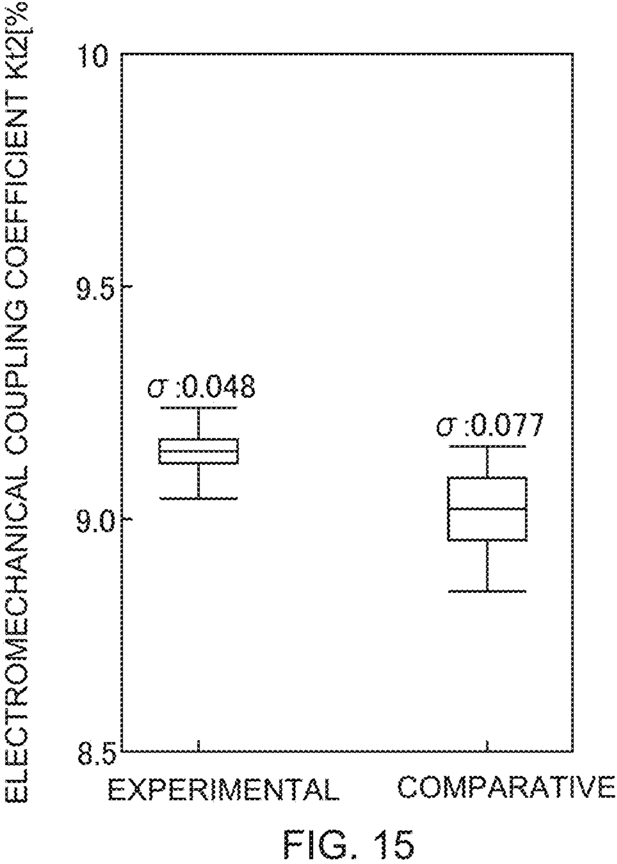
FIG. 15 is a graph showing an electromechanical coupling coefficient distribution.

FIG. 14 is a graph comparing a resonant frequency distribution fs of the experimental example with that of the comparative example. The standard deviation σ was 8.96 in the comparative example, whereas the standard deviation σ was 6.87 in the experimental example. Thus, the standard deviation of the resonant frequency was improved by about 30% according to the experimental example. FIG. 15 is a graph comparing an electromechanical coupling coefficient kt2 distribution of the experimental example with that of the comparative example. The standard deviation σ was 0.077 in the comparative example, whereas the standard deviation σ was 0.048 in the experimental example. Thus, the standard deviation σ of the electromechanical coupling coefficient kt2 was obviously reduced by half according to the experimental example. As described above, according to the experimental example of the second embodiment, the standard deviation σ of the resonant frequency fs and the electromechanical coupling coefficient kt2 was significantly reduced relative to those of the comparative example, and thus the characteristics of the FBAR were significantly improved.

Third Embodiment

Referring back to the flow diagram of FIG. 1, a method of manufacturing FBARs according to a third embodiment is similar to the method of the first embodiment except for the step of forming the piezoelectric film at step S14. Thus, step S14 of forming the piezoelectric film according to the third embodiment will be described below.

Figure 16A:
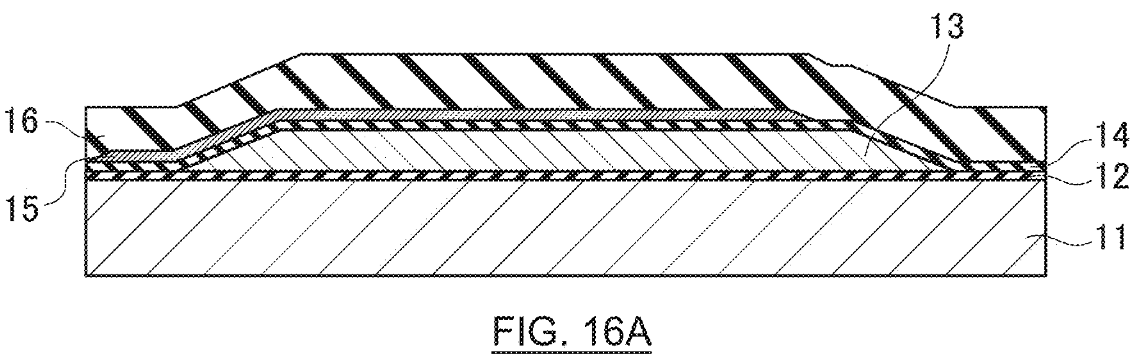
FIGS. 16A to 16C are cross-sectional views representing a method of manufacturing a film bulk acoustic wave resonator according to a third embodiment.

Referring now to the cross-sectional view of FIG. 16A, the piezoelectric film 16 is formed to cover the passivation layer 14 that is disposed on the sacrificial layer 13 formed over the main surface of the substrate 11, and the bottom electrode 15 that is disposed on the second passivation layer 14, similar to step S14 of the first embodiment. The third embodiment is different from the first embodiment including the piezoelectric film 16 formed by the first and second piezoelectric films 16*a* and 16*b* in that the piezoelectric film 16 of the third embodiment is a single piezoelectric film 16 formed from a piezoelectric material such as aluminum nitride (AlN) or zinc oxide (ZnO) to which an additive such as scandium (Sc), titanium (Ti), magnesium (Mg), zirconium (Zr) or hafnium (Hf) is added. As discussed below, the piezoelectric film 16 is configured to have an appropriate additive concentration.

Figure 17:
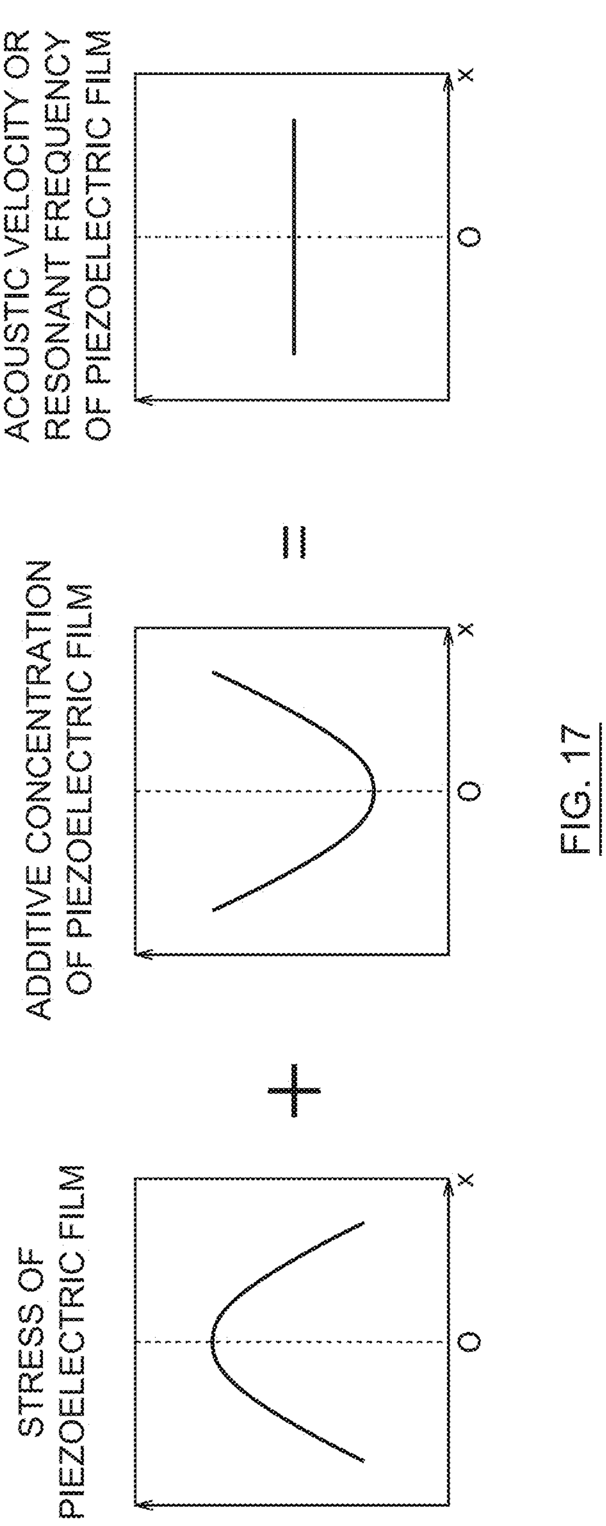
FIG. 17 is a schematic view illustrating a principle of fabricating a piezoelectric film according to the third embodiment.

FIG. 17 is a schematic view illustrating a principle of fabricating the piezoelectric film 16 according to the third embodiment. The stress distribution of the piezoelectric film 16 along the x-direction exhibits a substantially inverted U-shaped curve symmetric with respect to the origin O as shown in the left-side graph of FIG. 17. According to the third embodiment, the concentration distribution of the additive added to the piezoelectric film 16 is controlled as shown in the central graph of FIG. 17 to compensate the acoustic velocity or resonant frequency distribution originated from the stress distribution in the piezoelectric film 16 such that the acoustic velocity or resonant frequency of the piezoelectric film 16 can be uniformly distributed in the x-direction.

The acoustic velocity and the resonant frequency can monotonically decrease as a function of additive concentration as shown in FIGS. 11A and 11B, respectively, similar to the relationship of the acoustic velocity and resonant frequency versus the stress as shown in FIGS. 5A and 5B, respectively. Accordingly, the concentration of the additive added to the piezoelectric film 16 is configured to be distributed following the substantially U-shaped curve symmetrical with respect to the origin O.

Configuring the additive concentration distribution of the piezoelectric film 16 to follow the substantially U-shaped curve can compensate the acoustic velocity or resonant frequency distribution originated from the stress distribution of the piezoelectric film 16 and the acoustic velocity or resonant frequency distribution originated from the additive concentration distribution of the piezoelectric film 16. Thus, the acoustic velocity or resonant frequency can be uniformly distributed in the piezoelectric film 16. For example, as shown in the right-side graph of FIG. 17, the acoustic velocity or resonant frequency of the piezoelectric film 16 can be uniformly distributed regardless of the position in the x-direction. Accordingly, FBARs formed by dicing the substrate 11 into chips also have a uniform resonant frequency regardless of the position in the x-direction across the main surface of the substrate 11.

Figure 16B:
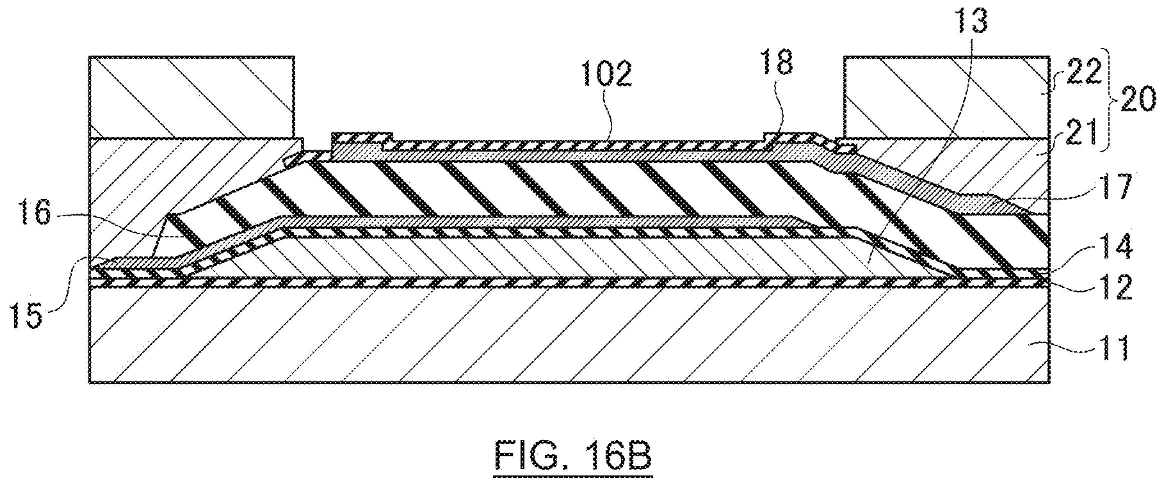
Figure 16C:
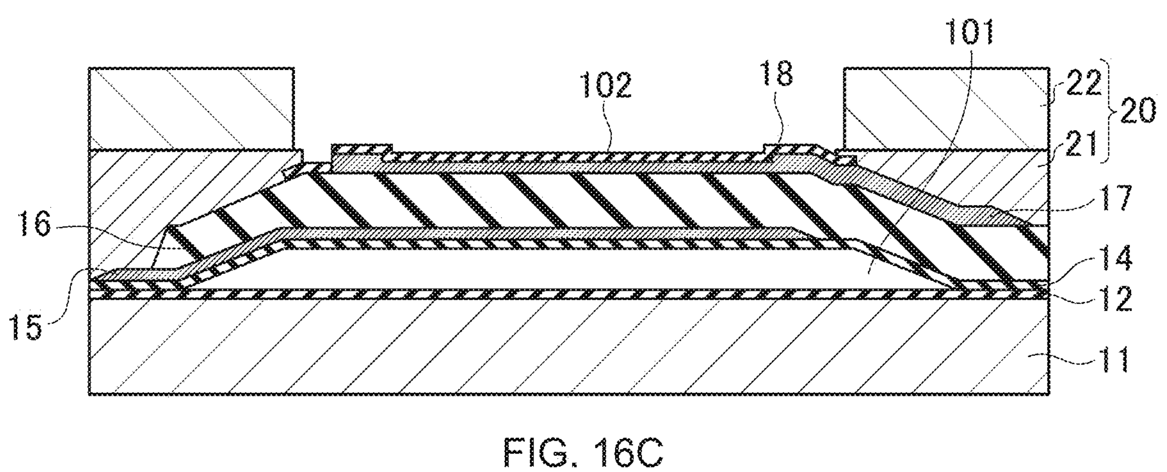

Steps S15 to S17 subsequent to step S14 are common between the third embodiment and the first embodiment. Thus, at step S15, a top electrode 17 of copper, for example, is formed on the piezoelectric film 16 as shown in FIG. 16B, and a third passivation layer 18 of silicon nitride, for example, is formed on the piezoelectric film 16 to cover the top electrode 17 in the active region 102 where the piezoelectric film 16 can oscillate. t step S16, an electrode layer 20 connected to each of the bottom and top electrodes 15 and 17 is formed. As shown in FIG. 16B, the electrode layer 20 includes a lower first electrode layer 21 formed from metal such as ruthenium (Ru), molybdenum (Mo), tungsten (W) or chromium (Cr) and an upper second electrode layer 22 formed from metal such as titanium (Ti) or copper (Cu). At step S17, the convex sacrificial layer 13 is removed by etching such that an air gap can be formed and covered with the dome-shaped piezoelectric film 16 and the like.

The FBARs manufactured according to the third embodiment can have a uniform resonant frequency no matter where respective FBARs exist on the main surface before being diced. This can eliminate a process of trimming or scraping the piezoelectric film 16 and the like to adjust respective resonant frequencies.

Film Bulk Acoustic Wave Filters

Figure 18:
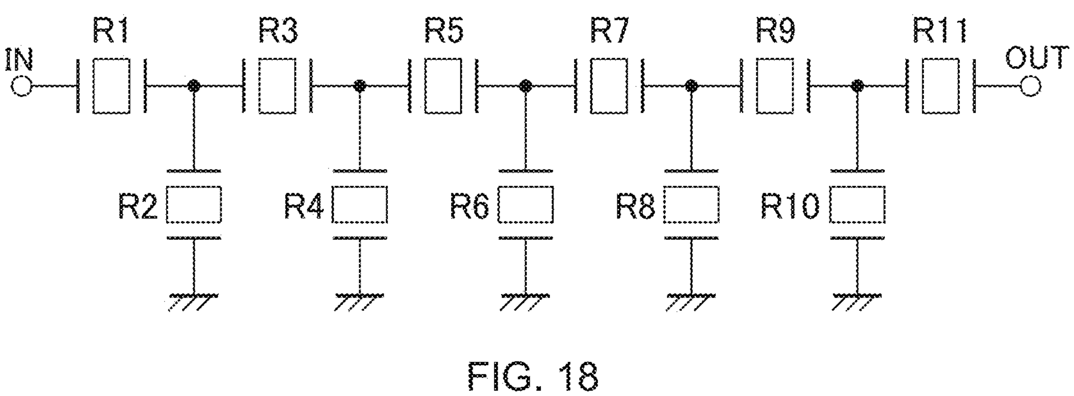
FIG. 18 is a schematic diagram of a film bulk acoustic wave filter.

FIG. 18 is a circuit diagram showing a bulk acoustic wave filter including FBARs according to an embodiment. The FBARs of an embodiment may be combined to form a film bulk acoustic wave filter that can operate in a radio frequency (RF) band. The film bulk acoustic wave filter of an embodiment may include at least one of the FBARs of an embodiment. One type of such filters may be known as a ladder filter. FIG. 18 shows an example of the ladder filter. The ladder filter includes a plurality of FBARs R1, R2, R3, R4, R5, R6, R7, R8, R9, R10, and R11 disposed between an input port IN and an output port OUT. The FBARs R1, R3, R5, R7, R9, and R11 are configured as series-arm resonators that are connected in series with each other along a signal line between the input port IN and the output port OUT. The FBARs R2, R4, R6, R8, and R10 are configured as parallel-arm resonators that are connected between the signal line and a reference potential such as ground. The parallel-arm resonators R2, R4, R6, R8, and R10 can be referred to as shunt resonators. In some embodiments, respective series-arm resonators R1, R3, R5, R7, R9, and R11 can have the same resonant frequency. In some embodiments, the plurality of shunt resonators R2, R4, R6, R8, and R10 can have resonant frequencies below those of series-arm resonators R1, R3, R5, R7, R9, and R11, respectively. At least one of the plurality of shunt resonators R2, R4, R6, R8, and R10 may have a first resonant frequency different from a resonant frequency of one of the other shunt resonator(s). At least one of the plurality of shunt resonators R2, R4, R6, R8, and R10 may have a second resonant frequency different from the first resonant frequency and also different from a resonant frequency of one of the other shunt resonator(s).

Film Bulk Acoustic Wave Filter Assemblies

Figure 19A:
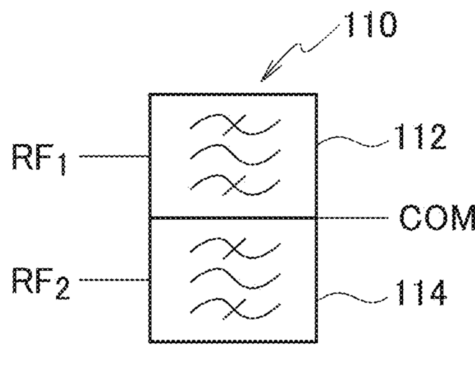
FIG. 19A is a schematic diagram of a duplexer according to an embodiment.

FIG. 19A is a schematic diagram of a duplexer 110 including a film bulk acoustic wave filter according to an embodiment. The duplexer 110 includes a first filter 112 and a second filter 114 coupled together at a common node COM. One of the filters in the duplexer 110 can be a transmit filter and the other of the filters in the duplexer 110 can be a receive filter. The transmission and receive filters may be configured as respective ladder filters each including a topology similar to the ladder filter shown in FIG. 18. In some other instances, such as in a diversity receive application, the duplexer 110 can include two receive filters. The common node COM can be an antenna node.

The first filter 112 is a film bulk acoustic wave filter configured to filter a radio frequency signal. The first filter 112 can include FBARs coupled between a first radio frequency node RF1 and the common node COM. The first radio frequency node RF1 can be a transmit node or a receive node. The first filter 112 includes one or more FBARs implemented in accordance with any suitable principles and advantages disclosed herein.

The second filter 114 can be any suitable filter configured to filter a second radio frequency signal. The second filter 114 can be, for example, an acoustic wave filter, an acoustic wave filter that includes one or more FBARs implemented in accordance with any suitable principles and advantages disclosed herein, an LC filter, a hybrid acoustic wave LC filter, or the like. The second filter 114 is coupled between a second radio frequency node RF2 and the common node COM. The first radio frequency node RF1 can be a transmit node or a receive node.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include one or more FBARs implemented in accordance with any suitable principles and advantages disclosed herein.

Figure 19B:
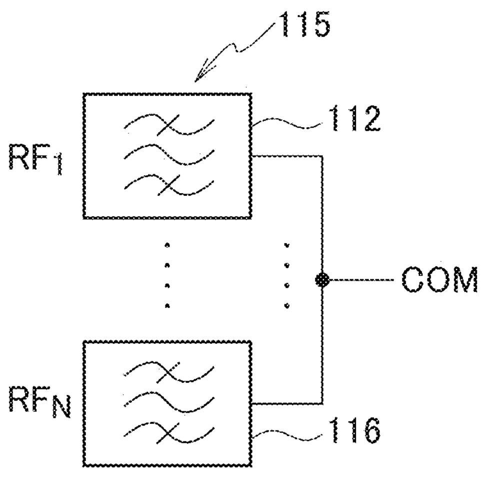
FIG. 19B is a schematic diagram of a multiplexer according to an embodiment.

FIG. 19B is a schematic diagram of a multiplexer 115 that includes a film bulk acoustic wave filter according to an embodiment. The multiplexer 115 includes a plurality of filters 112-116 coupled together at a common node COM. The plurality of filters can include any suitable number of filters. For instance, the plurality of filters can include three filters, four filters, five filters, six filters, seven filters, eight filters, or more or less number of filters. Some or all of the plurality of acoustic wave filters can be acoustic wave filters.

The first filter 112 is a film bulk acoustic wave filter configured to filter a radio frequency signal. The first radio frequency node RF1 can be a transmit node or a receive node. The first filter 112 includes one or more FBARs implemented in accordance with any suitable principles and advantages disclosed herein. The other filter(s) of the multiplexer 115 can include one or more FBARs, one or more film bulk acoustic wave filters that include one or more FBARs implemented in accordance with any suitable principles and advantages disclosed herein, one or more LC filters, one or more hybrid acoustic wave LC filters, or any suitable combination thereof.

The FBAR filters discussed herein can be implemented in a variety of packaged modules. Some example packaged modules will now be discussed in which any suitable principles and advantages of the acoustic wave filters and/or acoustic wave resonators discussed herein can be implemented. Example packaged modules may include a package that encloses the illustrated circuit elements. A module including a radio frequency component can be referred to as a radio frequency module. The illustrated circuit elements can be disposed on a common packaging substrate. The packaging substrate can be a laminate substrate, for example. FIGS. 20 to 23 are schematic block diagrams of illustrative packaged modules according to certain embodiments. Any suitable combination of features of these packaged modules can be implemented with each other. While duplexers are illustrated in the example packaged modules of FIGS. 20 to 23, any other suitable multiplexer that includes a plurality of filters coupled to a common node can be implemented instead of one or more duplexers. For instance, a quadplexer can be implemented in certain applications. Alternatively or additionally, one or more filters of a packaged module can be configured as a transmit filter or a receive filter that is not included in a multiplexer.

Figure 20:
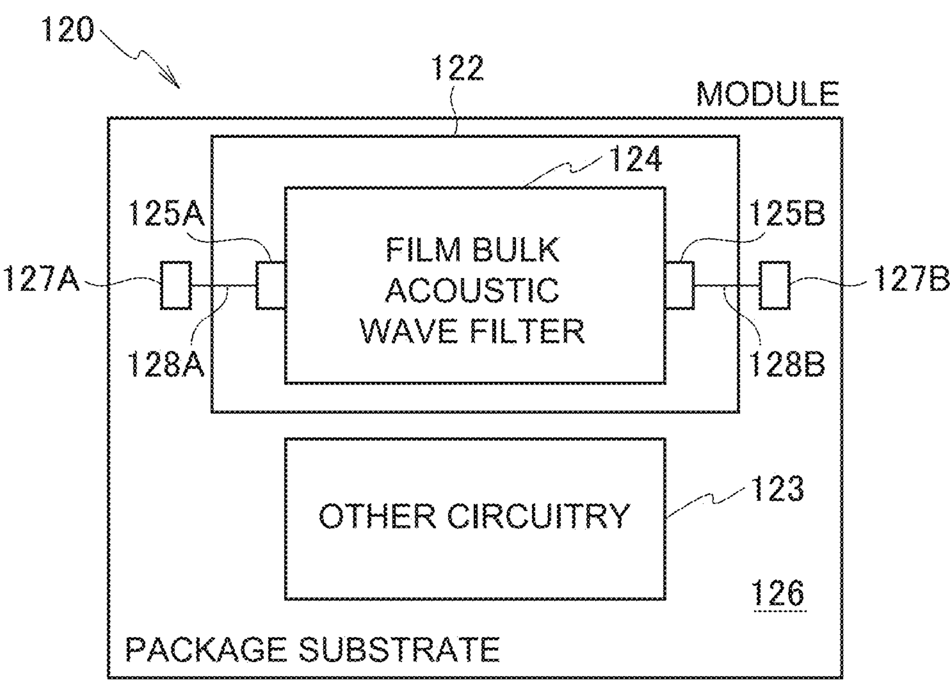
FIG. 20 is a schematic diagram of a radio frequency module according to an embodiment.

FIG. 20 is a schematic diagram of a radio frequency module 120 that includes a film bulk acoustic wave component 122 according to an embodiment. The illustrated radio frequency module 120 includes the film bulk acoustic wave component 122 and other circuitry 123. The film bulk acoustic wave component 122 can include one or more film bulk acoustic wave filters in accordance with any suitable combination of features disclosed herein. The film bulk acoustic wave component 122 can include an FBAR die that includes FBARs, for example.

The film bulk acoustic wave component 122 shown in FIG. 20 includes one or more film bulk acoustic wave filters 124 and terminals 125A and 125B. The one or more film bulk acoustic wave filters 124 include one or more FBARs implemented in accordance with any suitable principles and advantages disclosed herein. The terminals 125A and 125B can serve, for example, as an input contact and an output contact. Although two terminals are illustrated, any suitable number of terminals can be implemented for a particular application. The film bulk acoustic wave component 122 and the other circuitry 123 are on the same package substrate 126 in FIG. 20. The packaging substrate 126 can be a laminate substrate. The terminals 125A and 125B can be electrically connected to contacts 127A and 127B, respectively, on the package substrate 126 by way of electrical connectors 128A and 128B, respectively. The electrical connectors 128A and 128B can be bumps or wire bonds, for example.

The other circuitry 123 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters, the like, or any suitable combination thereof. The other circuitry 123 can be electrically connected to the one or more film bulk acoustic wave filters 124. The radio frequency module 120 can include one or more packaging structures to, for example, provide protection and/or facilitate easier handling of the radio frequency module 120. Such a packaging structure can include an overmold structure formed over the packaging substrate 126. The overmold structure can encapsulate some or all of the components of the radio frequency module 120.

Figure 21:
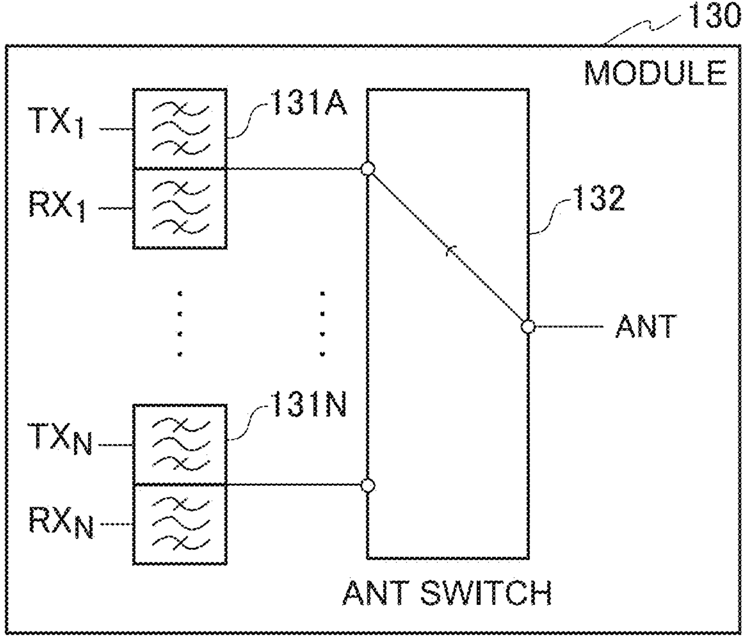
FIG. 21 is a schematic diagram of a radio frequency module according to an embodiment.

FIG. 21 is a schematic block diagram of a radio frequency module 130 that includes duplexers 131A to 131N and an antenna switch 132. One or more filters of the duplexers 131A to 131N can include two or more acoustic wave resonators having resonant frequencies in accordance with any suitable principles and advantages disclosed herein. Any suitable number of duplexers 131A to 131N can be implemented. The antenna switch 132 can have a number of throws corresponding to the number of duplexers 131A to 131N. The antenna switch 132 can include one or more additional throws coupled to one or more filters external to the radio frequency module 130 and/or coupled to other circuitry. The antenna switch 132 can electrically couple a selected duplexer to an antenna port of the radio frequency module 130.

Figure 22:
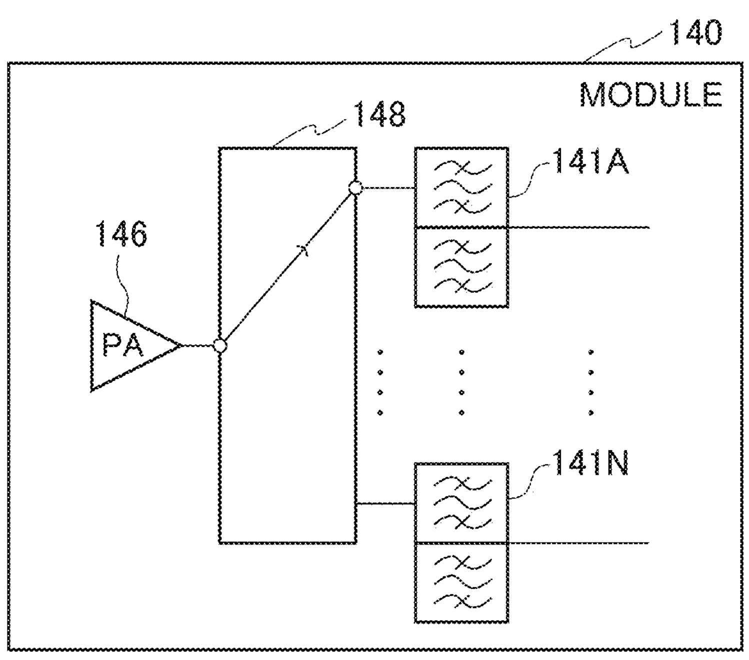
FIG. 22 is a schematic diagram of a radio frequency module according to an embodiment.

FIG. 22 is a schematic block diagram of a radio frequency module 140 that includes a power amplifier 146, a radio frequency switch 148, and duplexers 141A to 141N according to an embodiment. The power amplifier 146 can amplify a radio frequency signal. The radio frequency switch 148 can be a multi-throw radio frequency switch. The radio frequency switch 148 can electrically couple an output of the power amplifier 146 to a selected transmit filter of the duplexers 141A to 141N. One or more filters of the duplexers 141A to 141N can include any suitable number of acoustic wave resonators implemented in accordance with any suitable principles and advantages disclosed herein. Any suitable number of duplexers 141A to 141N can be implemented.

Figure 23:
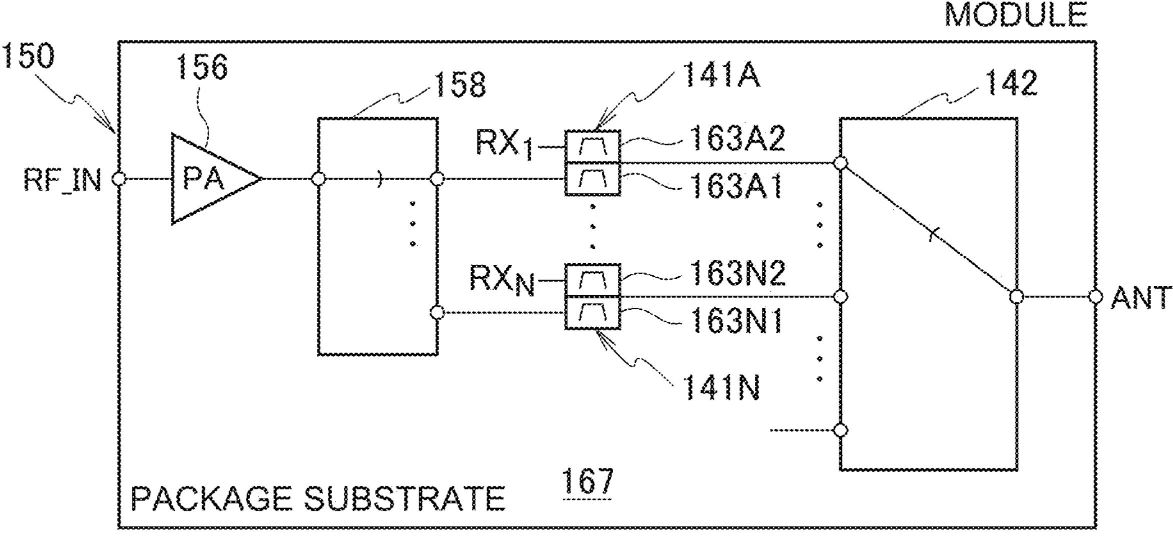
FIG. 23 is a schematic diagram of a radio frequency module according to an embodiment.

FIG. 23 is a schematic diagram of a radio frequency module 150 that includes a film bulk acoustic wave filter according to an embodiment. As illustrated, the radio frequency module 150 includes duplexers 141A to 141N that include respective transmit filters 163A1 to 163N1 and respective receive filters 163A2 to 163N2, a power amplifier 156, a select switch 158, and an antenna switch 142. The radio frequency module 150 can include a package that encloses the illustrated elements. The illustrated elements can be disposed on the same package substrate 167. The packaging substrate 167 can be a laminate substrate, for example. The radio frequency module 150 that includes a power amplifier 156 can be referred to as a power amplifier module. The radio frequency module 150 can include a subset of the elements illustrated in FIG. 23 and/or additional elements. The radio frequency module 150 may include at least one acoustic wave device implemented in accordance with any suitable principles and advantages disclosed herein.

The duplexers 141A to 141N can each include two film bulk acoustic wave filters coupled to a common node. For example, the two film bulk acoustic wave filters can be a transmit filter and a receive filter. As illustrated, the transmit filter and the receive filter can each be a band pass filter arranged to filter a radio frequency signal. One or more of the transmit filters 163A1 to 163N1 can include an acoustic wave resonator implemented in accordance with any suitable principles and advantages disclosed herein. One or more of the receive filters 163A2 to 163N2 can include an acoustic wave resonator implemented in accordance with any suitable principles and advantages disclosed herein. Although FIG. 23 illustrates duplexers, any suitable principles and advantages disclosed herein can be implemented in other multiplexers (e.g., quadplexers, hexaplexers, octoplexers, etc.) and/or in switch-plexers.

The power amplifier 156 can amplify a radio frequency signal. The illustrated switch 158 is a multi-throw radio frequency switch. The switch 158 can electrically couple an output of the power amplifier 156 to a selected transmit filter of the transmit filters 163A1 to 163N1. In some instances, the switch 158 can electrically connect the output of the power amplifier 156 to more than one of the transmit filters 163A1 to 163N1. The antenna switch 142 can selectively couple a signal from one or more of the duplexers 141A to 141N to an antenna port ANT. The duplexers 141A to 141N can be associated with different frequency bands and/or different modes of operation (e.g., different power modes, different signaling modes, etc.).

Wireless Communication Devices

Figure 24A:
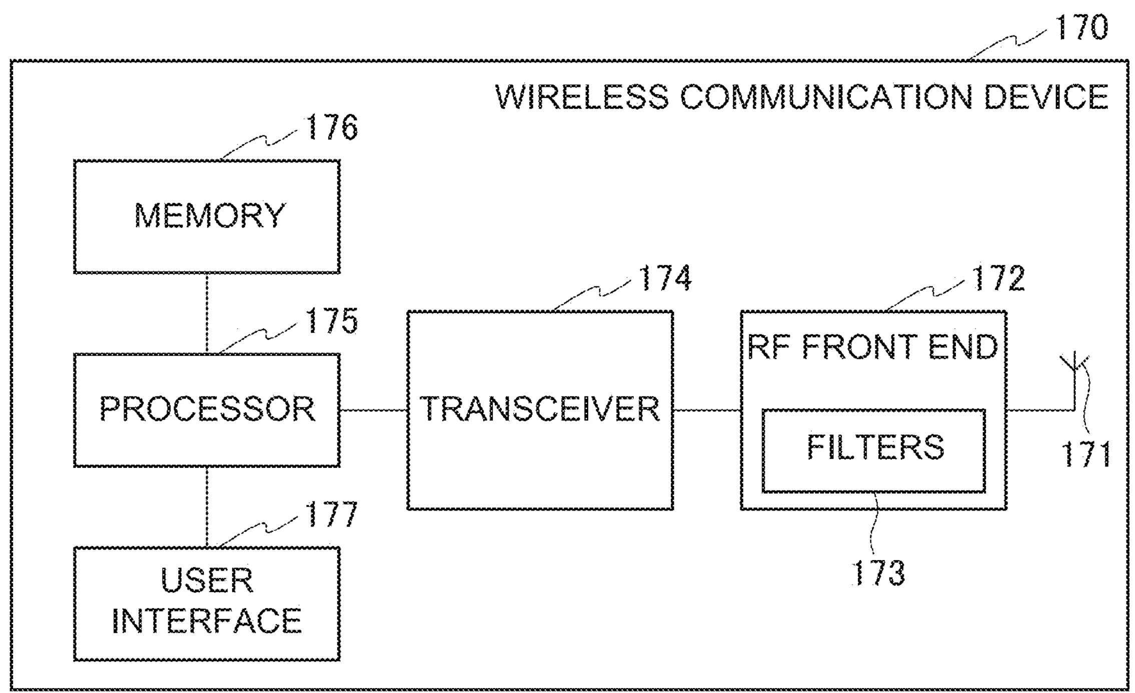
FIG. 24A is a schematic diagram of a wireless communication device according to an embodiment.

The filters including FBARs disclosed herein can be implemented in a variety of wireless communication devices. FIG. 24A is a schematic diagram of a wireless communication device 170 that includes filters 173 in a radio frequency (RF) front end 172 according to an embodiment. One or more of the filters 173 can include an acoustic wave resonator implemented in accordance with any suitable principles and advantages disclosed herein. The wireless communication device 170 can be any suitable wireless communication device. For instance, a wireless communication device 170 can be a mobile phone such as a smart phone. As illustrated, the wireless communication device 170 includes an antenna 171, an RF front end 172, a transceiver 174, a processor 175, a memory 176, and a user interface 177. The antenna 171 can transmit RF signals provided by the RF front end 172. Such RF signals can include carrier aggregation signals. The antenna 171 can receive RF signals and provide the received RF signals to the RF front end 172 for processing. Such RF signals can include carrier aggregation signals. The wireless communication device 170 can include two or more antennas in certain instances.

The RF front end 172 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 172 can transmit and receive RF signals associated with any suitable communication standards. One or more of the filters 173 can include an acoustic wave resonator that includes any suitable combination of features of the embodiments disclosed above.

The transceiver 174 can provide RF signals to the RF front end 172 for amplification and/or other processing. The transceiver 174 can also process an RF signal provided by a low noise amplifier of the RF front end 172. The transceiver 174 is in communication with the processor 175. The processor 175 can be a baseband processor. The processor 175 can provide any suitable baseband processing functions for the wireless communication device 170. The memory 176 can be accessed by the processor 175. The memory 176 can store any suitable data for the wireless communication device 170. The user interface 177 can be any suitable user interface, such as a display with touch screen capabilities.

Figure 24B:
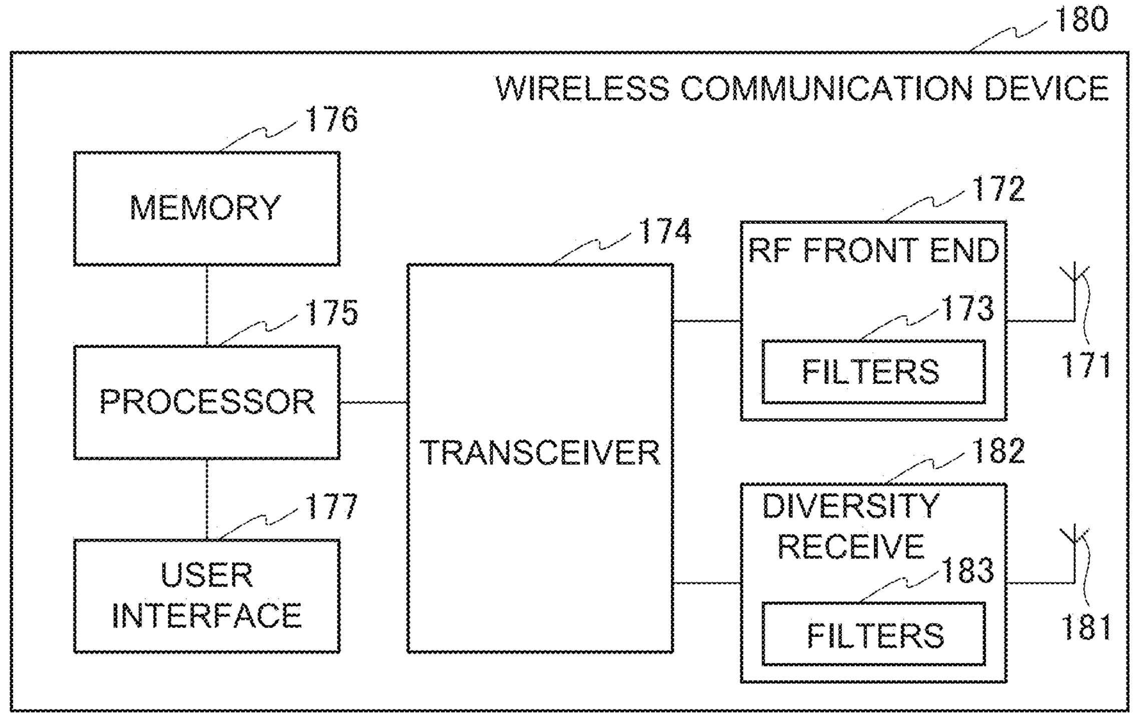
FIG. 24B is a schematic diagram of a wireless communication device according to an embodiment.

FIG. 24B is a schematic diagram of a wireless communication device 180 that includes filters 173 in a radio frequency front end 172 and second filters 183 in a diversity receive module 182. The wireless communication device 180 is like the wireless communication device 170 of FIG. 24A, except that the wireless communication device 180 also includes diversity receive features. As illustrated in FIG. 24B, the wireless communication device 180 includes a diversity antenna 181, a diversity module 182 configured to process signals received by the diversity antenna 181 and including the second filters 183, and a transceiver 174 in communication with both the radio frequency front end 172 and the diversity receive module 182. One or more of the second filters 183 can include an acoustic wave resonator implemented in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexers, devices, modules, wireless communication devices, apparatus, methods, and systems described herein may be embodied in a variety of other forms. Furthermore, various omissions, substitutions and changes in the form of the resonators, filters, multiplexers, devices, modules, wireless communication devices, apparatus, methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A film bulk acoustic wave resonator comprising:

a substrate having a main surface;

a lower electrode disposed on the main surface the substrate; and a piezoelectric film disposed on the lower electrode, the piezoelectric film having a lower layer with a first non-uniform acoustic velocity profile across the main surface of the substrate and an upper layer with a second non-uniform acoustic velocity profile across the main surface of the substrate that is opposite to the first non-uniform acoustic velocity profile that at least partially compensates for the first non-uniform acoustic velocity profile and provides the piezoelectric film with an acoustic velocity profile that is more uniform across the main surface of the substrate than the first non-uniform acoustic velocity profile.

2. The film bulk acoustic wave resonator of claim 1 wherein the lower layer has a first non-uniform stress distribution across the main surface of the substrate that results in the lower layer exhibiting the first non-uniform acoustic velocity profile across the main surface of the substrate, and the upper layer has a second non-uniform stress distribution across the main surface of the substrate that results in the upper layer exhibiting the second non-uniform acoustic velocity profile across the main surface of the substrate.

3. The film bulk acoustic wave resonator of claim 1 wherein the lower layer has a first non-uniform doping profile across the main surface of the substrate that results in the lower layer exhibiting the first non-uniform acoustic velocity profile across the main surface of the substrate.

4. The film bulk acoustic wave resonator of claim 3 wherein the upper layer has a second non-uniform doping profile across the main surface of the substrate that results in the upper layer exhibiting the second non-uniform acoustic velocity profile across the main surface of the substrate.

5. The film bulk acoustic wave resonator of claim 1 wherein the upper layer has a non-uniform doping profile across the main surface of the substrate that results in the upper layer exhibiting the second non-uniform acoustic velocity profile across the main surface of the substrate.

6. The film bulk acoustic wave resonator of claim 5 wherein the upper layer has a same thickness as the lower layer in a central active region of the film bulk acoustic wave resonator.

7. A film bulk acoustic wave filter assembly comprising:

a first film bulk acoustic wave filter coupled to a common node; and a second film bulk acoustic wave filter coupled to the common node, at least one of the first film bulk acoustic wave filter and the second film bulk acoustic wave filter including a plurality of film bulk acoustic wave resonators to filter a radio frequency signal, at least one of the plurality of film bulk acoustic wave resonators including a substrate having a main surface, a lower electrode disposed on the main surface of the substrate, and a piezoelectric film disposed on the lower electrode, the piezoelectric film having a lower layer with a first non-uniform acoustic velocity profile across the main surface of the substrate and an upper layer with a second non-uniform acoustic velocity profile across the main surface of the substrate that is opposite to the first non-uniform acoustic velocity profile that at least partially compensates for the first non-uniform acoustic velocity profile and provides the piezoelectric film with an acoustic velocity profile that is more uniform across the main surface of the substrate than the first non-uniform acoustic velocity profile.

8. The film bulk acoustic wave filter assembly of claim 7 further comprising:

a third film bulk acoustic wave filter coupled to the common node; and a fourth film bulk acoustic wave filter coupled to the common node.

9. The film bulk acoustic wave filter assembly of claim 7 wherein the lower layer has a first non-uniform stress distribution across the main surface of the substrate that results in the lower layer exhibiting the first non-uniform acoustic velocity profile across the main surface of the substrate, and the upper layer has a second non-uniform stress distribution across the main surface of the substrate that results in the upper layer exhibiting the second non-uniform acoustic velocity profile across the main surface of the substrate.

10. The film bulk acoustic wave filter assembly of claim 7 wherein the lower layer has a first non-uniform doping profile across the main surface of the substrate that results in the lower layer exhibiting the first non-uniform acoustic velocity profile across the main surface of the substrate.

11. The film bulk acoustic wave filter assembly of claim 10 wherein the upper layer has a second non-uniform doping profile across the main surface of the substrate that results in the upper layer exhibiting the second non-uniform acoustic velocity profile across the main surface of the substrate.

12. The film bulk acoustic wave filter assembly of claim 7 wherein the upper layer has a non-uniform doping profile across the main surface of the substrate that results in the upper layer exhibiting the second non-uniform acoustic velocity profile across the main surface of the substrate.

13. The film bulk acoustic wave filter assembly of claim 12 wherein the upper layer has a same thickness as the lower layer in a central active region of the at least one of the plurality of film bulk acoustic wave resonators.

14. A film bulk acoustic wave resonator comprising:

a substrate having a main surface;

a lower electrode disposed on the main surface of the substrate; and a piezoelectric film disposed on the lower electrode, the piezoelectric film having a lower layer with a first non-uniform doping profile across the main surface of the substrate and an upper layer with a second non-uniform doping profile across the main surface of the substrate different from the first non-uniform doping profile.

15. The film bulk acoustic wave resonator of claim 14 wherein the lower layer has a first non-uniform acoustic velocity profile across the main surface of the substrate and the upper layer has a second non-uniform acoustic velocity profile across the main surface of the substrate that is opposite to the first non-uniform acoustic velocity profile that at least partially compensates for the first non-uniform acoustic velocity profile and provides the piezoelectric film with an acoustic velocity profile across the main surface of the substrate that is more uniform than the first non-uniform acoustic velocity profile.

16. The film bulk acoustic wave resonator of claim 14 wherein the upper layer has a same thickness as the lower layer in a central active region of the film bulk acoustic wave resonator.

* * * * *